(12) United States Patent
Takahashi et al.

(10) Patent No.: US 11,011,581 B2
(45) Date of Patent: May 18, 2021

(54) MULTI-LEVEL LOOP CUT PROCESS FOR A THREE-DIMENSIONAL MEMORY DEVICE USING PITCH-DOUBLED METAL LINES

(71) Applicant: WESTERN DIGITAL TECHNOLOGIES, INC., San Jose, CA (US)

(72) Inventors: Yuji Takahashi, San Jose, CA (US); Jo Sato, Yokkaichi (JP); Wei Kuo Shih, Cupertino, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/436,185

(22) Filed: Jun. 10, 2019

(65) Prior Publication Data
US 2020/0388649 A1    Dec. 10, 2020

(51) Int. Cl.
*H01L 45/00* (2006.01)
*H01L 27/24* (2006.01)

(52) U.S. Cl.
CPC ........ *H01L 27/249* (2013.01); *H01L 27/2427* (2013.01); *H01L 45/06* (2013.01);
(Continued)

(58) Field of Classification Search
CPC .. H01L 21/0338; H01L 27/2481; H01L 45/06
See application file for complete search history.

(56) References Cited

U.S. PATENT DOCUMENTS 7,790,531 B2 *  9/2010  Tran ................. H01L 21/02518
                                                            438/157
8,097,498 B2    1/2012  Purayath et al.
(Continued)

FOREIGN PATENT DOCUMENTS

KR    10-2011-0033028 A    3/2011

OTHER PUBLICATIONS

U.S. Appl. No. 15/898,571, filed Feb. 17, 2018, SanDisk Technologies LLC.
(Continued)

*Primary Examiner* — Bradley Smith
*Assistant Examiner* — David J Goodwin
(74) *Attorney, Agent, or Firm* — The Marbury Law Group PLLC

(57) ABSTRACT

First elongated loop-shaped conductive material portions are formed over a substrate. A two-dimensional array of memory pillar structures is formed over the first elongated loop-shaped conductive material portions. Second elongated loop-shaped conductive material portions over the two-dimensional array of memory pillar structures. Each of the elongated loop-shaped conductive material potions includes a respective pair of line segments and a respective pair of end segments adjoined to ends of the respective pair of line segments. A moat trench that at least partially laterally encloses the two-dimensional array of memory pillar structures can be formed by performing an anisotropic etch process that removes parts of the first and second elongated loop-shaped conductive material portions, thereby separating each loop-shaped conductive material portion into two disjoined line segments.

20 Claims, 33 Drawing Sheets

(52) U.S. Cl.
CPC ...... *H01L 45/1233* (2013.01); *H01L 45/1253* (2013.01); *H01L 45/1608* (2013.01); *H01L 45/143* (2013.01); *H01L 45/144* (2013.01)

(56) References Cited

U.S. PATENT DOCUMENTS

| | | | | |
|---|---|---|---|---|
| 8,629,048 | B1* | 1/2014 | Sipani | H01L 21/0337 438/587 |
| 9,397,145 | B1* | 7/2016 | Sills | H01L 27/2409 |
| 10,199,434 | B1 | 2/2019 | Lee et al. | |
| 2007/0049011 | A1* | 3/2007 | Tran | H01L 21/0337 438/637 |
| 2009/0027938 | A1* | 1/2009 | Wells | G11C 13/0004 365/51 |
| 2010/0176368 | A1* | 7/2010 | Ko | H01L 45/147 257/5 |
| 2010/0321988 | A1* | 12/2010 | Wells | G11C 5/02 365/163 |
| 2011/0207330 | A1 | 8/2011 | Ohuchi | |
| 2013/0175695 | A1 | 7/2013 | Bicksler | |
| 2014/0054534 | A1 | 2/2014 | Pellizzer et al. | |
| 2014/0291604 | A1 | 10/2014 | Pellizzer et al. | |
| 2015/0279906 | A1* | 10/2015 | Lindenberg | H01L 45/144 257/5 |
| 2019/0326357 | A1* | 10/2019 | Castro | H01L 27/249 |
| 2020/0098988 | A1* | 3/2020 | Kim | H01L 45/1675 |

OTHER PUBLICATIONS

U.S. Appl. No. 15/924,944, filed Mar. 19, 2018, SanDisk Technologies LLC.
U.S. Appl. No. 16/019,745, filed Jun. 27, 2018, SanDisk Technologies LLC.
U.S. Appl. No. 16/021,694, filed Jun. 28, 2018, SanDisk Technologies LLC.
U.S. Appl. No. 16/410,326, filed May 13, 2019, SanDisk Technologies LLC.
U.S. Appl. No. 16/410,376, filed May 13, 2019, SanDisk Technologies LLC.
Notification of Transmittal of the International Search Report and Written Opinion of the International Search Authority for International Patent Application No. PCT/US2020/021797, dated Jul. 6, 2020, 11 pages.

* cited by examiner

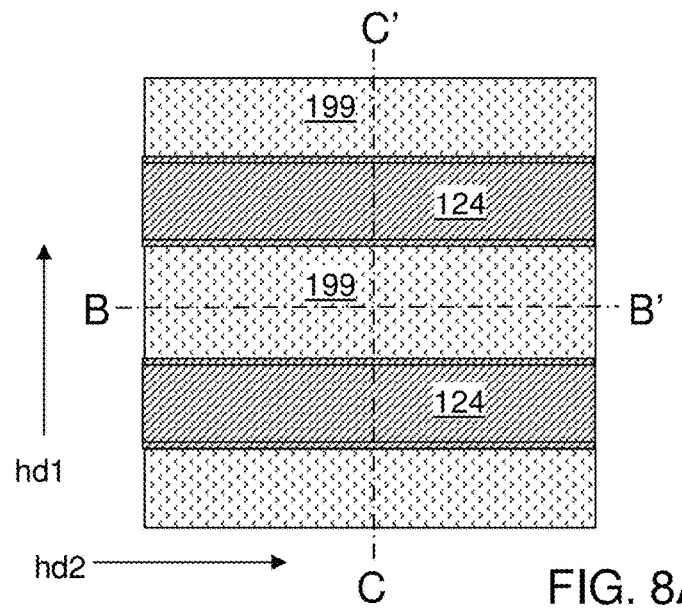
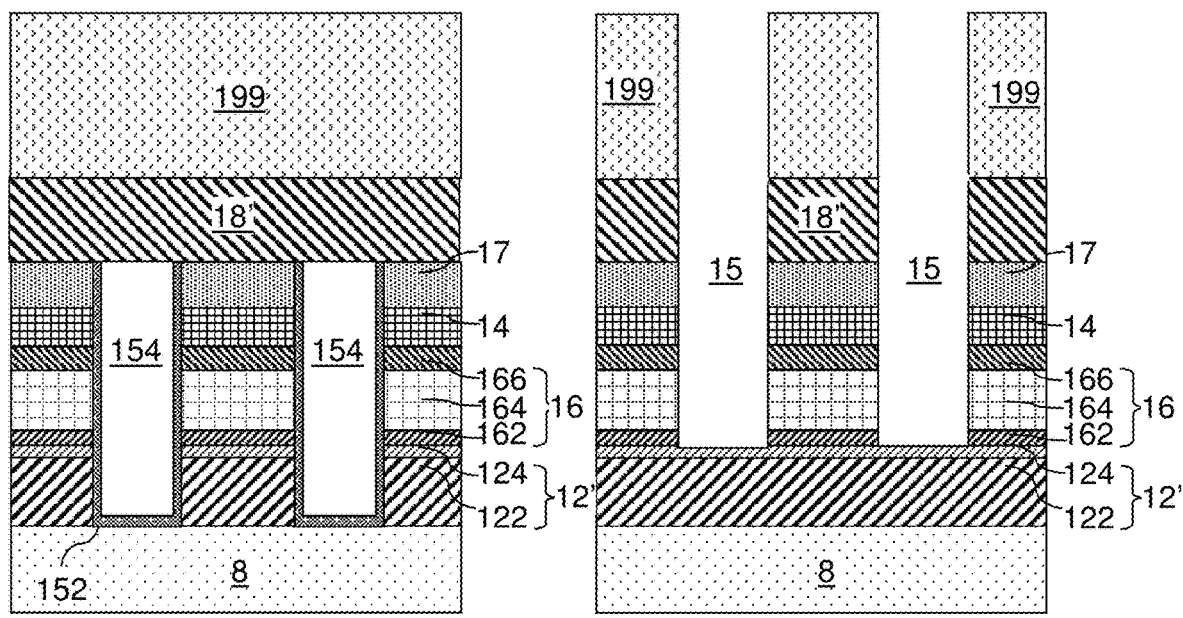
FIG. 8A
FIG. 8B
FIG. 8C

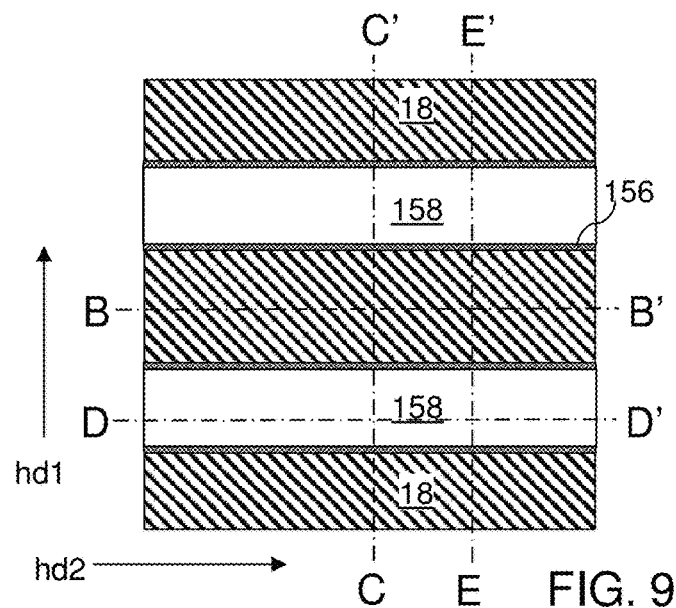
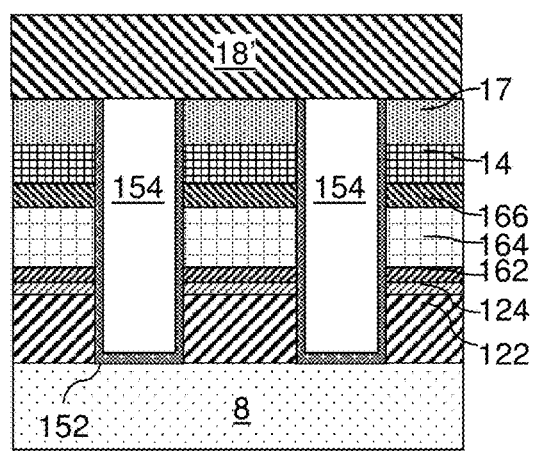
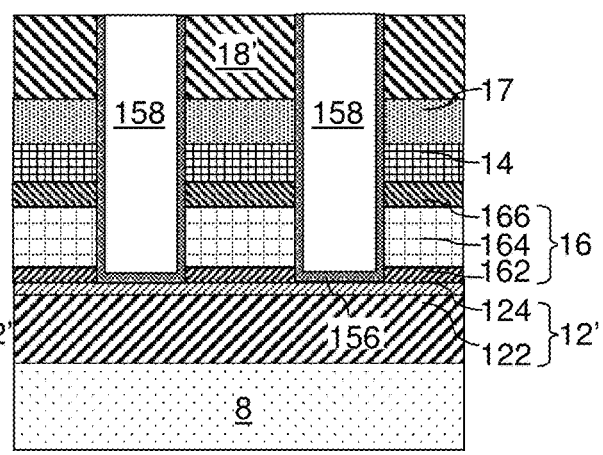
FIG. 9A
FIG. 9B
FIG. 9C

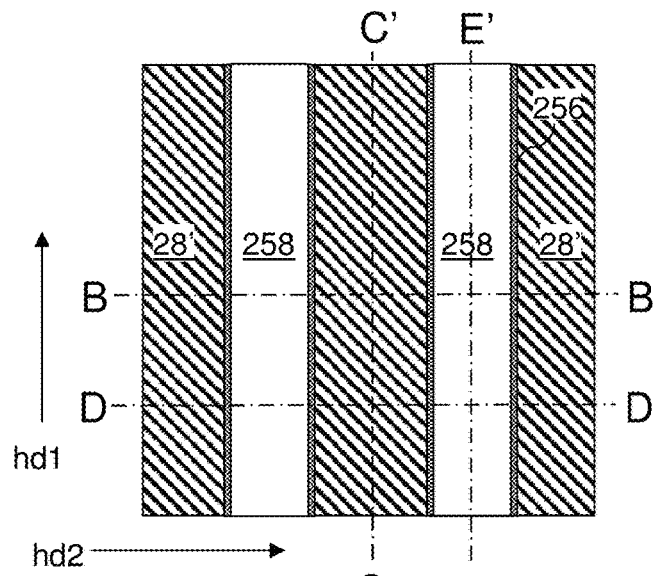
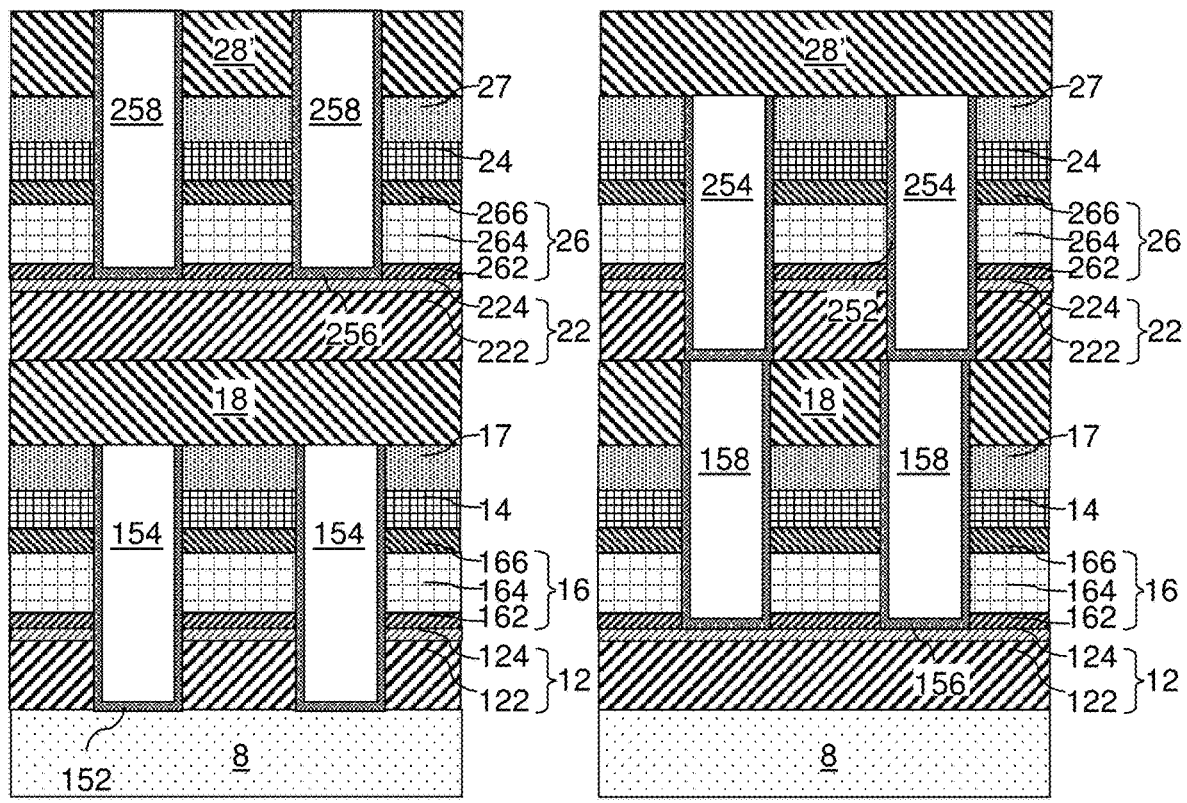
FIG. 14A
FIG. 14B            FIG. 14C

MULTI-LEVEL LOOP CUT PROCESS FOR A THREE-DIMENSIONAL MEMORY DEVICE USING PITCH-DOUBLED METAL LINES

FIELD

The present disclosure relates generally to the field of semiconductor devices and specifically to a multi-level loop cut process for a three-dimensional memory device employing pitch-doubled metal lines and structures formed by the same.

BACKGROUND

A phase change material (PCM) memory device (also known as a phase change random access memory "PCRAM" or "PRAM") is a type of non-volatile memory device that stores information as a resistivity state of a material that can be in different resistivity states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change material amorphous in a first part of a programming process. The second part of the programming process includes control of the cooling rate of the phase change material. If rapid quenching occurs, the phase change material can cool into an amorphous high resistivity state. If slow cooling occurs, the phase change material can cool into a crystalline low resistivity state.

SUMMARY

According to an aspect of the present disclosure, a method of forming a device structure is provided, which comprises: forming first elongated loop-shaped conductive material portions over a substrate, wherein each of the first elongated loop-shaped conductive material potions includes a respective pair of first line segments and a respective pair of first end segments adjoined to ends of the respective pair of first line segments; forming a two dimensional array of memory pillar structures over the first elongated loop-shaped conductive material portions; forming second elongated loop-shaped conductive material portions over the two-dimensional array of memory pillar structures, wherein each of the second elongated loop-shaped conductive material potions includes a respective pair of second line segments and a respective pair of second end segments adjoined to ends of the respective pair of second line segments; and forming a moat trench that at least partially laterally encloses the two-dimensional array of memory pillar structures by performing an anisotropic etch process that removes parts of the first elongated loop-shaped conductive material portions and parts of the second elongated loop-shaped conductive material portions.

BRIEF DESCRIPTION OF THE DRAWINGS

FIG. 5C is a top-down view of a portion of the exemplary structure of FIGS. 5A and 5B.

FIG. 8A is a vertical cross-sectional view of a region of the exemplary structure after formation of a two-dimensional array of first memory pillar structures and second elongated loop-shaped conductive material portions according to an embodiment of the present disclosure.

FIG. 8B is a vertical cross-sectional view of the exemplary structure along the vertical plane B-B' of FIG. 8A.

FIG. 8C is a vertical cross-sectional view of the exemplary structure along the vertical plane C-C' of FIG. 8A.

FIG. 9A is a top-down view of a region the exemplary structure after formation of a first-level dielectric matrix according to an embodiment of the present disclosure.

FIG. 9B is a vertical cross-sectional view of the exemplary structure along the vertical plane B-B' of FIG. 9A.

FIG. 9C is a vertical cross-sectional view of the exemplary structure along the vertical plane C-C' of FIG. 9A.

FIG. 13A is a top-down view of a region of the exemplary structure of FIG. 11C after formation of the dielectric moat trench fill structure according to an embodiment of the present disclosure.

FIG. 14A is a vertical cross-sectional view of a region of the exemplary structure after formation of a two-dimensional array of second memory pillar structures and a second-level dielectric matrix according to an embodiment of the present disclosure.

FIG. 14B is a vertical cross-sectional view along the vertical plane B-B' of FIG. 14A.

FIG. 14C is a vertical cross-sectional view along the vertical plane C-C' of FIG. 14A.

DETAILED DESCRIPTION

Figure 1A:
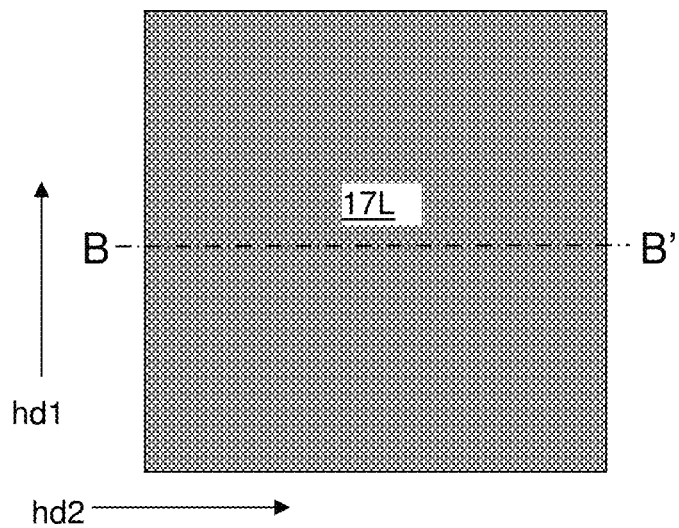
FIG. 1A is a top-down view of an exemplary structure for forming a three-dimensional memory device after formation of a first layer stack including a first blanket electrically conductive layer, a first phase change memory layer, a first selector layer, and an optional first barrier layer according to an embodiment of the present disclosure.

A pitch-doubling process is a process that employs a combination of lithographic patterning and a spacer formation process to reduce the pitch of a line and space pattern by 50%, thereby increasing the density of a line pattern twofold below the minimum printable pitch of a lithographically printed line and space pattern. Generally, the first lithographic patterning process forms a one-dimensional array of line-shaped mandrel structures. Each line-shaped mandrel structure may be trimmed such that the spacing between each neighboring pair of line-shaped mandrel structures is several times (e.g., about three times) the width of each line-shaped mandrel structure. Spacer structures are formed around each line-shaped mandrel structure by conformal deposition and an anisotropic etch of a spacer material layer. Each of the spacer structures can have a lateral thickness of about the width of a line-shaped mandrel structure, thereby providing a linear array of line-shaped portions of the spacer structures. The line-shaped mandrel structures can be removed selective to the spacer structures. Each spacer structure can have a pair of line-shaped portions and a pair of end segments (e.g., connecting segments) that connect the pair of line-shaped portions. The end segments of the spacer structures are removed by performing a loop cut process to provide a true line and space pattern. Each loop cut process uses a lithographic patterning process and an etch process. A method according to an embodiment of the present disclosure includes a simultaneous loop cut step in both a word line and a bit line during formation of the bit lines and word lines a three-dimensional memory device, such as a three-dimensional PCM memory device. As discussed above, embodiments of the present disclosure are directed to a multi-level loop cut process for a three-dimensional memory device employing pitch-doubled metal lines and structures formed by the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
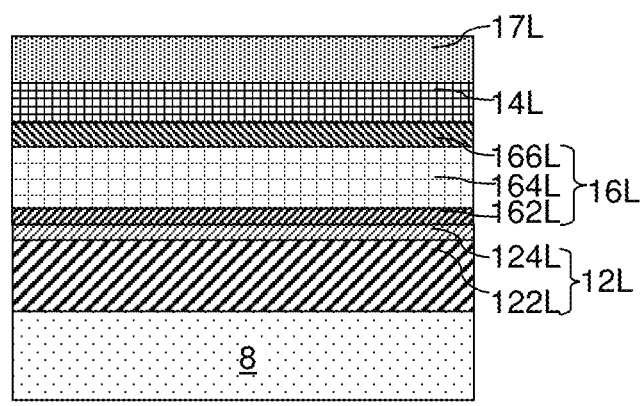
FIG. 1B is a vertical cross-sectional view of the exemplary structure along the vertical plane B-B' of FIG. 1A.

Referring to FIGS. 1A and 1B, an exemplary structure for forming a three-dimensional phase change memory device is illustrated, which includes a substrate 8. The substrate 8 includes an insulating material layer in an upper portion, and may optionally include additional layers (not illustrated) underneath, which can include, for example, a semiconductor material layer and interconnect level dielectric layers embedding metal interconnect structures therein. In one embodiment, semiconductor devices such as field effect transistors may be provided on the semiconductor material layer, and the metal interconnect structures can provide electrically conductive paths among the semiconductor devices. The exemplary structure includes a memory array region, which is illustrated herein, and a peripheral region (not illustrated) including interconnect structures and/or peripheral devices. Memory cells are subsequently formed in the memory array region.

A first vertical stack (12L, 16L, 14L, 17L), which is also referred to as a first layer stack, is formed over the substrate 8. The substrate 8 can include additional structures and circuitry required for operation of the memory arrays. The first vertical stack (12L, 16L, 14L, 17L) can include a first blanket electrically conductive layer 12L, a first phase change memory layer 16L, a first selector layer 14L, and an optional first barrier layer 17L. Each layer in the first vertical stack (12L, 16L, 14L, 17L) can be formed as a blanket material layer, i.e., an unpatterned material layer that laterally extend along a first horizontal direction hd1 and a second horizontal direction hd2 that is perpendicular to the first horizontal direction hd1.

The first blanket electrically conductive layer 12L includes at least one conductive material layer, which can be at least one metallic material layer. For example, the first blanket electrically conductive layer 12L can include a layer stack, from bottom to top, of a first metal layer 122L (such as a tungsten layer) and a first electrode buffer layer 124L (such as a tungsten nitride layer, a titanium nitride layer, a carbon layer, a carbon layer, or combination thereof). The thickness of the first metal layer 122L can be in a range from 20 nm to 100 nm, such as from 30 nm to 70 nm, although lesser and greater thicknesses can also be employed. The thickness of the first electrode buffer layer 124L can be in a range from 31 nm to 10 nm, such as from 1.5 nm to 5 nm, although lesser and greater thicknesses can also be employed.

The first phase change memory layer 16L includes a first phase change memory material layer 164L. The first phase change memory material layer 164L include a phase change memory material. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the first phase change memory material layer 164L can be in a range from 1 nm to 60 nm, such as from 10 nm to 50 nm and/or from 20 nm to 40 nm, although lesser and greater thicknesses can also be employed.

The first phase change memory layer 16L can optionally include a first lower conductive liner layer 162L underlying the first phase change memory material layer 164L, and can optionally include a first upper conductive liner layer 166L overlying the first phase change memory material layer 164L. In one embodiment, the first lower conductive liner layer 162L can include a conductive metallic nitride such as titanium nitride, tungsten or tungsten nitride, and/or selenium, tellurium, doped silicon, germanium, or an alloy and/or a metal such as silver, copper, and/or aluminum. In one embodiment, the first upper conductive liner layer 166L can include a conductive metallic nitride such as titanium nitride, tantalum nitride, or tungsten nitride, and/or selenium, tellurium, doped silicon, germanium, or an alloy and/or platinum, molybdenum, tungsten, tantalum, nickel, or alloy.

The first selector layer 14L includes a non-Ohmic material that provides electrical connection of electrical isolation depending on the magnitude and/or the polarity of an externally applied voltage bias thereacross. In one embodiment, the first selector layer 14L includes at least one threshold switch material layer. The at least one threshold switch material layer includes any suitable threshold switch material which exhibits non-linear electrical behavior, such as an ovonic threshold switch material or volatile conductive bridge. In another embodiment, the first selector layer 14L includes at least one non-threshold switch material layer, such as a tunneling selector material or diode materials (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is lowered below a critical holding voltage. Throughout the resistive state changes, the ovonic threshold switch material can remain non-crystalline (e.g., amorphous). In one embodiment, the ovonic threshold switch material can comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor material. The ovonic threshold switch material layer can include a first ovonic threshold switch material layer 14L which contains any ovonic threshold switch material. In one embodiment, the first ovonic threshold switch material layer 14L can include, and/or can consist essentially of, a GeSeAs alloy (e.g., $Ge_{10}As_{36}Se_{54}$), a GeTeAs, a GeSeTeSe alloy, a GeSe alloy, a SeAs alloy, a GeTe alloy, or a SiTe alloy (e.g., $Si_{20}Te_{80}$).

In one embodiment, the material of the first ovonic threshold switch material layer 14L can be selected such that the resistivity of the first ovonic threshold switch material layer 14L decreases at least by two orders of magnitude (i.e., by more than a factor of 100) upon application of an external bias voltage that exceeds a critical bias voltage magnitude (also referred to as threshold voltage). In one embodiment, the composition and the thickness of the first ovonic threshold switch material layer 14L can be selected such that the critical bias voltage magnitude can be in a range from 1 V to 6 V, although lesser and greater voltages can also be employed for the critical bias voltage magnitude. The thickness of the first ovonic threshold switch material layer 14L can be, for example, in a range from 1 nm to 50 nm, such as from 5 nm to 25 nm, although lesser and greater thicknesses can also be employed.

The optional first barrier layer 17L, if present, includes a barrier material, and can be formed on top of the switch material layer 14L. Optionally, an additional barrier layer (not shown) including a barrier material can be provided between the first phase change memory layer 16L and the switch material layer 14L. In case two barrier layers are employed, the lower one is referred to as a first lower barrier layer, and the upper one is referred to as a first upper barrier layer. The barrier material is a material that can prevent diffusion of, and provide effective encapsulation of, the first phase change memory material. In one embodiment, the barrier material can include, and/or can consist essentially of, amorphous carbon or carbon nitride. The thickness of the first barrier layer 17L can be in a range from 1 nm to 70 nm, such as from 5 nm to 30 nm, although lesser and grater thicknesses can also be employed.

Figure 2A:
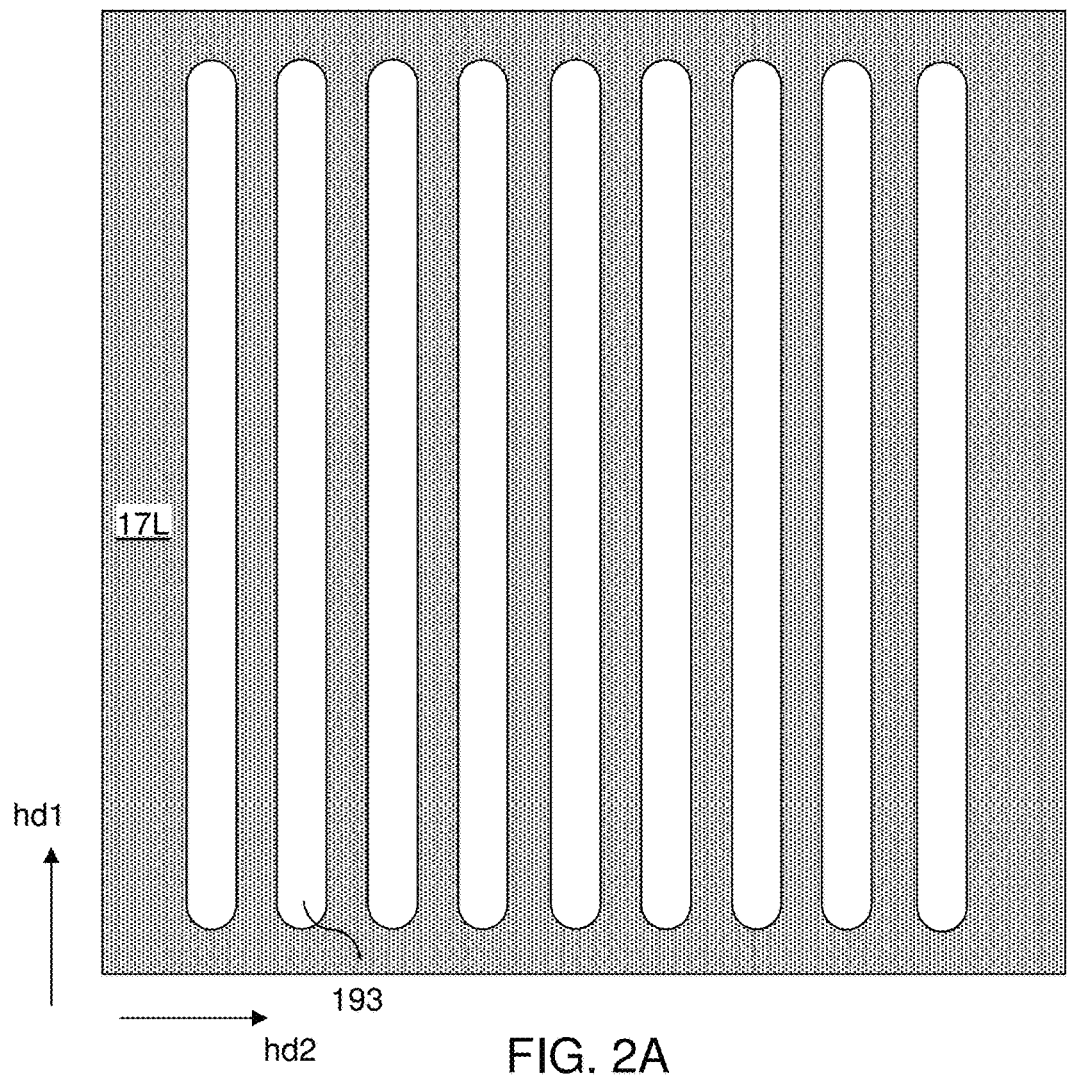
FIG. 2A is a top-down view of the exemplary structure after formation of first template line structures according to an embodiment of the present disclosure.
Figure 2B:
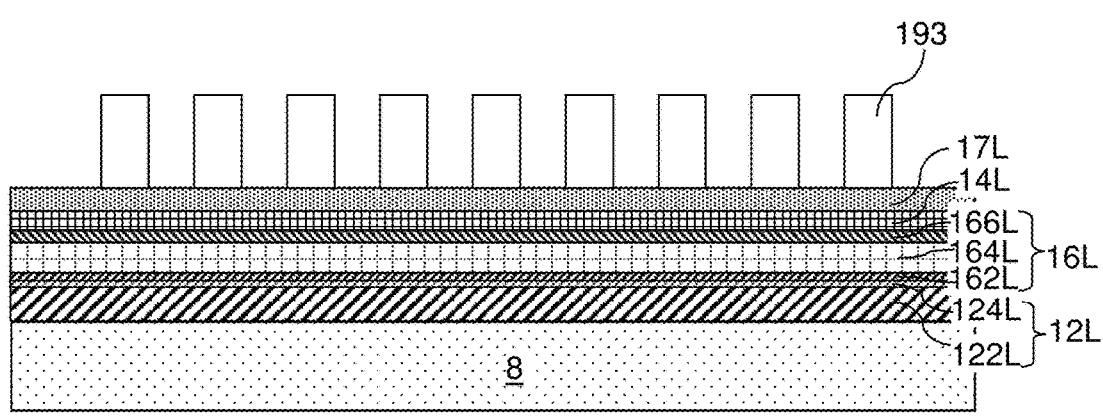
FIG. 2B is a vertical cross-sectional view of the exemplary structure along the vertical plane B-B' of FIG. 2A.

Referring to FIGS. 2A-2C, a first template material layer can be applied over the first vertical stack (12L, 16L, 14L, 17L), and can be lithographically patterned to form a line and space pattern. Each patterned portion of the first template material layer is herein referred to as a first template line structure 193. The first template material layer (and the first template line structures 193) includes a material that can be subsequently removed selective to the material of the first barrier layer 17L. For example, the first template material layer can include polysilicon, amorphous silicon, silicon oxide, or silicon nitride. A photoresist layer can be applied over the first template material layer, and can be lithographically patterned with a line and space pattern. The pattern in the photoresist layer can be transferred through the template material layer to form the first template line structures 193. The photoresist layer can be subsequently removed, for example, by ashing.

The first template line structures 193 can laterally extend along a first horizontal direction hd1 and laterally spaced apart along a second horizontal direction hd2. The line trenches can have a uniform width that is invariant with translation along the first horizontal direction hd1. The pattern of the first template line structures 193 can be a periodic pattern that is repeated along the second horizontal direction hd2 with a pitch that is equal to the sum of the width of a first template line structure 193 and the spacing between a neighboring pair of first template line structures 193. The pitch can be in a range from 32 nm to 600 nm, although lesser and greater pitches can also be employed.

Figure 3A:
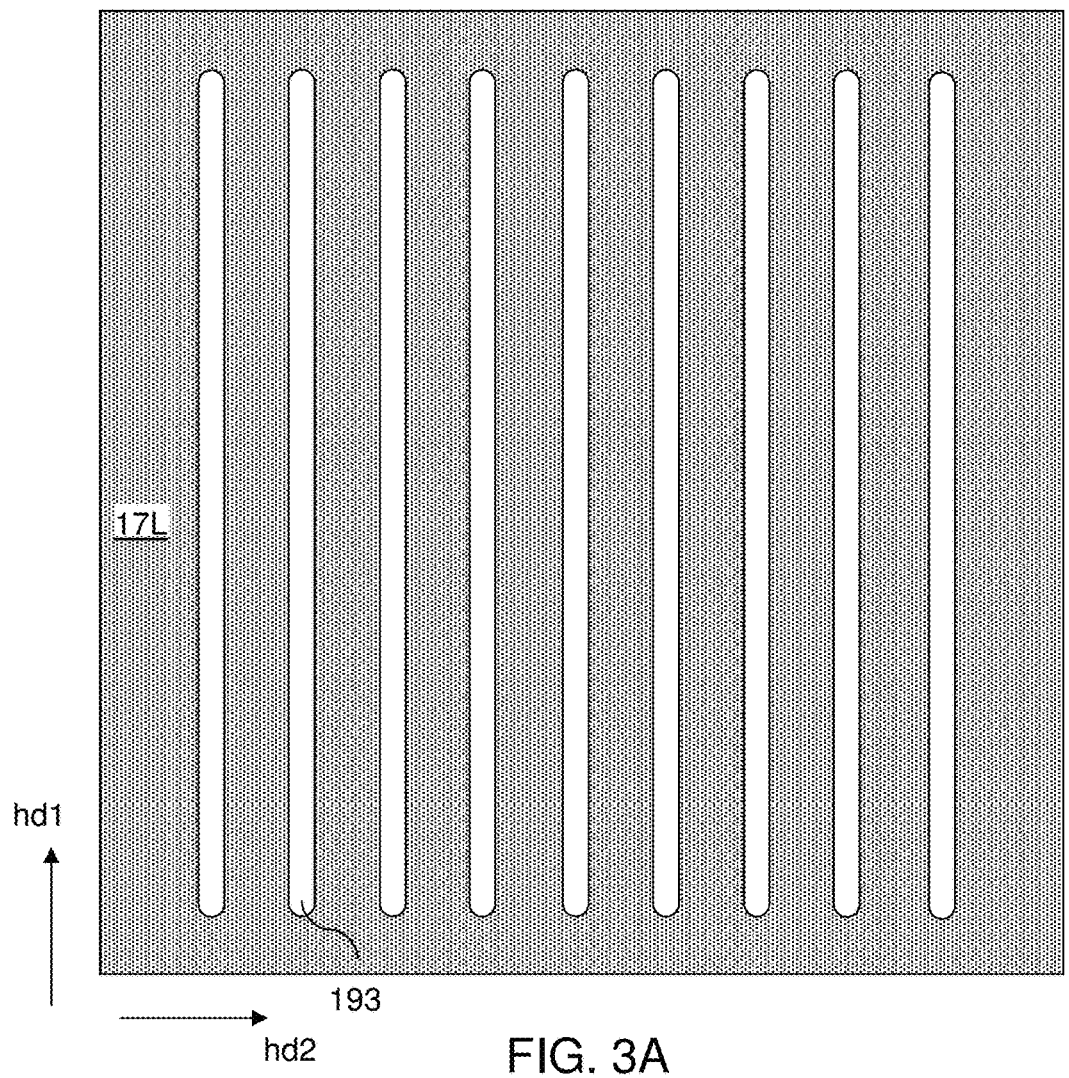
FIG. 3A is a top-down view of the exemplary structure after isotropic trimming of the first template line structures according to an embodiment of the present disclosure.
Figure 3B:
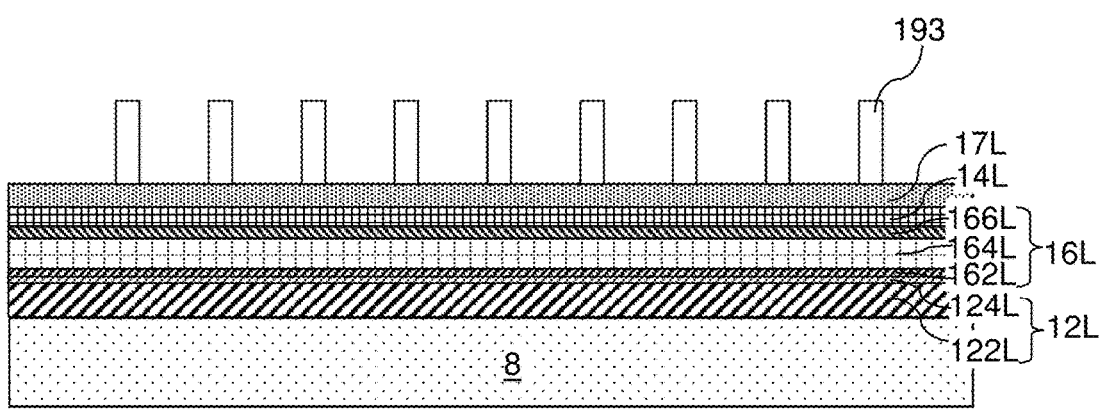
FIG. 3B is a vertical cross-sectional view of the exemplary structure along the vertical plane B-B' of FIG. 3A.

Referring to FIGS. 3A and 3B, the first template line structures 193 can be isotropically recessed by a recess etch. The recess etch includes an isotropic etch process, which may be a wet etch process or a dry etch process. The first template line structures 193 can be isotropically thinned such that the spacing between a neighboring pair of first template line structures 193 is greater than the width of each first template line structure 193. The isotropically recessed remaining portions of the first template line structures 193 constitute a one-dimensional periodic array.

Figure 4A:
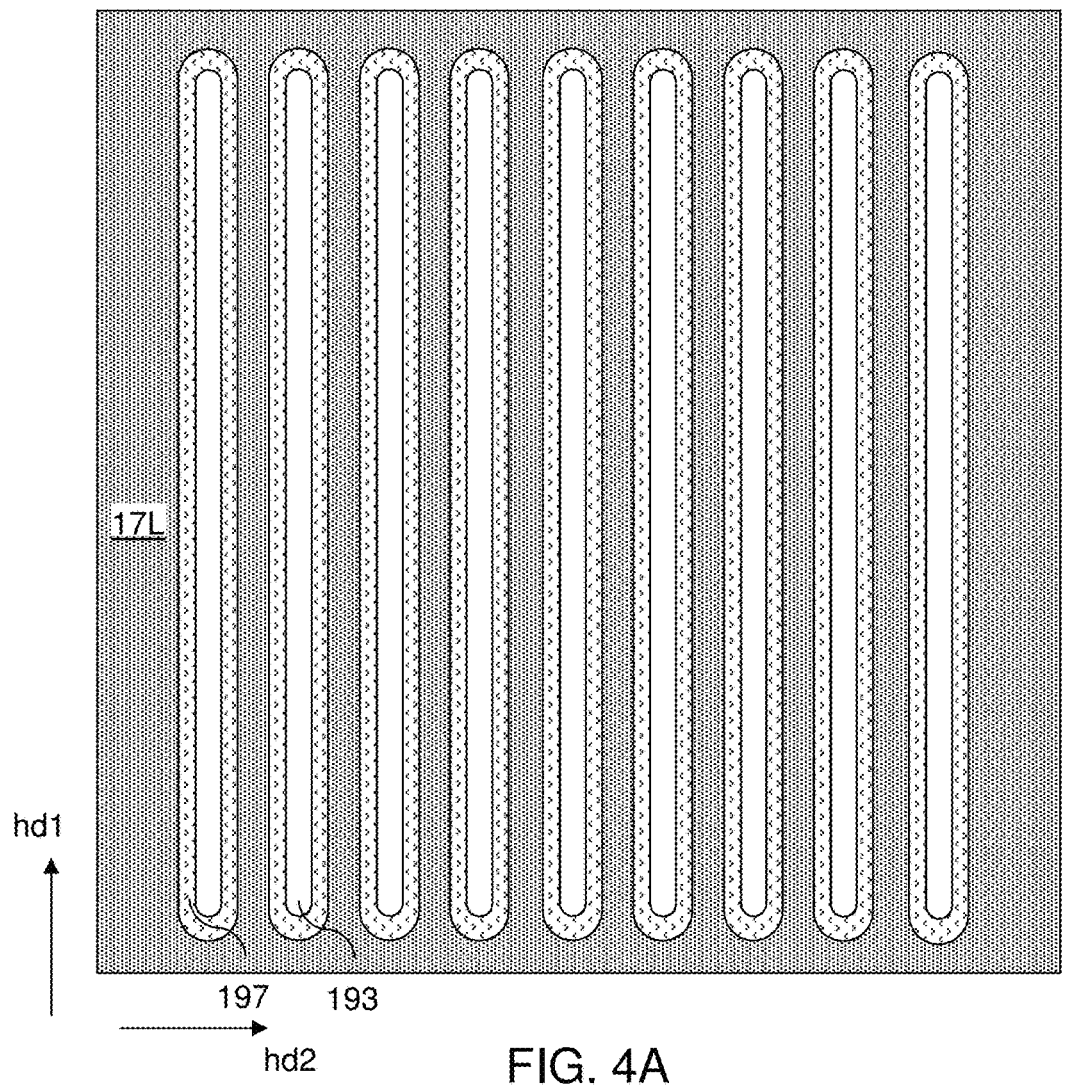
FIG. 4A is a top-down view of the exemplary structure after first etch mask spacer structures according to an embodiment of the present disclosure.
Figure 4B:
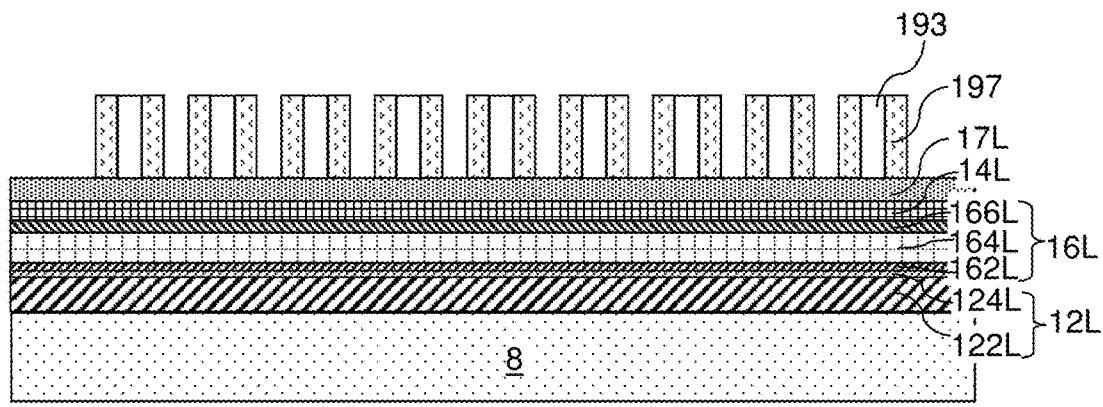
FIG. 4B is a vertical cross-sectional view of the exemplary structure along the vertical plane B-B' of FIG. 4A.

Referring to FIGS. 4A and 4B, a conformal etch mask material layer can be deposited over the first template line structures 193, and can be anisotropically etched to remove horizontal portions thereof. The conformal etch mask material layer includes a material that is different from the materials of the first template line structures 193 and the first barrier layer 17L. For example, if the first template line structures 193 include a semiconductor material, the conformal etch mask material layer can include silicon oxide, silicon nitride, photoresist or another polymer material, or a dielectric metal oxide. If the first template line structures 193 include silicon oxide, the conformal etch mask material layer can include a semiconductor material, silicon nitride, photoresist or another polymer material, or a dielectric metal oxide. If the first template line structures 193 include silicon nitride, the conformal etch mask material layer can include a semiconductor material, silicon oxide, photoresist or another polymer material, or a dielectric metal oxide. Remaining portions of the conformal etch mask material layer after the anisotropic etch process constitute first etch mask spacers 197. In one embodiment, the thickness of the conformal etch mask material layer can be selected such that lengthwise portions of the first etch mask spacers 197 that extend along the first horizontal direction hd1 have a same center-to-center distance throughout, which can be the same as one half of the pitch of the first template line structures 193. Thus, pitch doubling (i.e., forming a structure having half the pitch of a previously provided structure) can be achieved for the lengthwise portions of the first etch mask spacers 197 relative to the pitch of the first template line structures 193.

Referring to FIGS. 5A-5E, the first template line structures 193 can be removed selective to the first etch mask spacer structures 197 and the first barrier layer 17L. For example, a wet etch process or a dry etch process that removes the material of the first template line structures 193 selective to the materials of the first etch mask spacer structures 197 and the first barrier layer 17L can be performed. For example, if the first template line structures 193 includes amorphous silicon or polysilicon material, then a wet etch process hot trimethyl-2 hydroxyethyl ammonium hydroxide ("hot TMY") or tetramethyl ammonium hydroxide (TMAH) may be performed to remove the first template line structures 193.

Figure 5A:
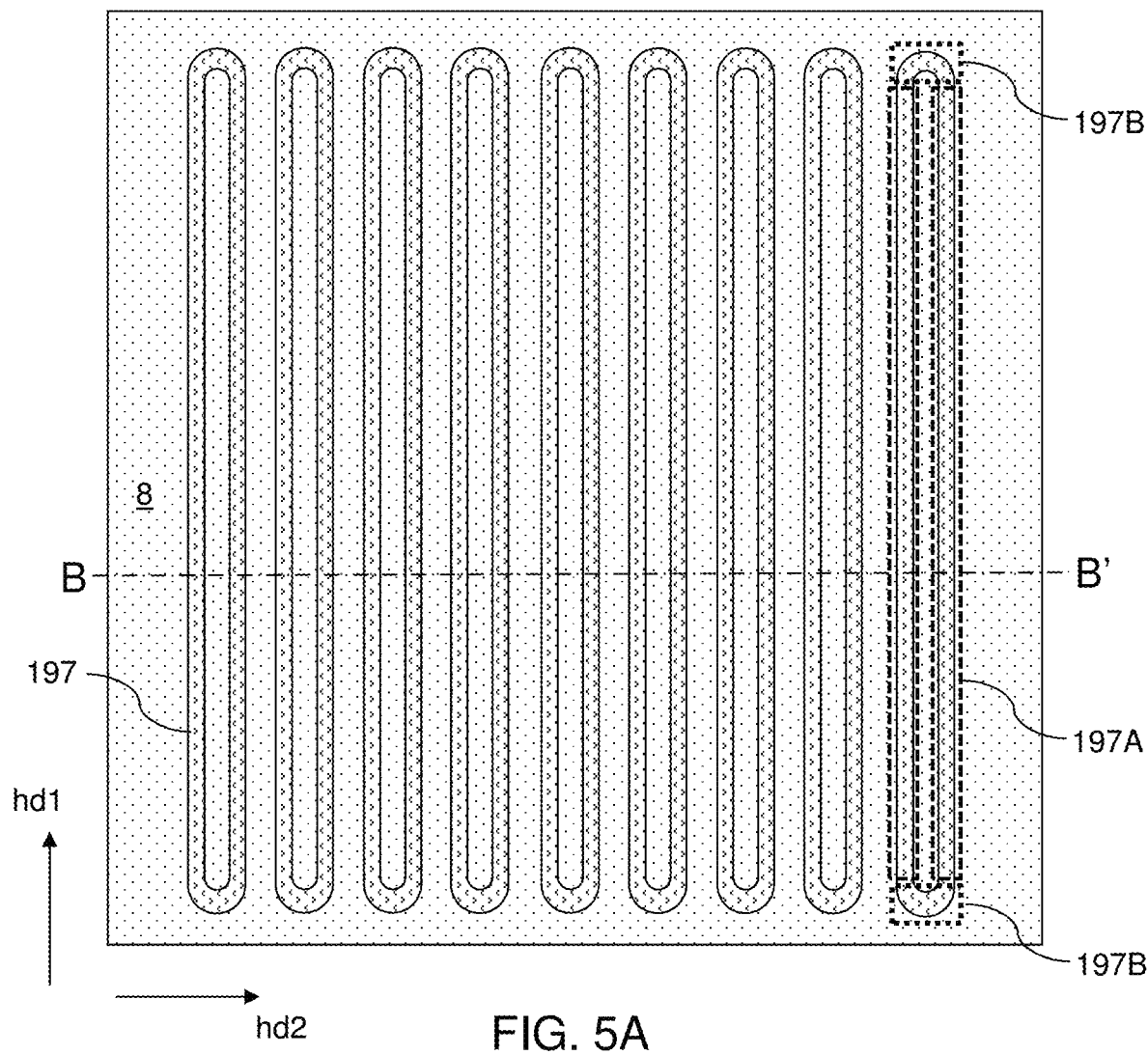
FIG. 5A is a top-down view of the exemplary structure after formation of first stacked elongated loop-shaped structures laterally spaced by lower first-level trenches through the first layer stack according to an embodiment of the present disclosure.

As shown in FIG. 5A, the first etch mask spacer structures 197 include line segments 197A and end segments 197B. The line segments 197A and end segments 197B together form a loop structure. In order to provide a true line and space pattern, the end segments 197B of the first etch mask spacers 197 and the layers underlying the end segments 197B are removed, such as by etching. This process is referred to as a "loop cut" process. The embodiments of the present disclosure provide a cost-effective, simultaneous loop cut process for multiple patterns, such as a loop cut process for word lines and bit lines performed at the same time, which is described in more detail below.

An anisotropic etch process is performed employing the first etch mask spacer structures 197 as an etch mask. The anisotropic etch process etches through portions of the first vertical stack (12L, 16L, 14L, 17L) that are not masked by the first etch mask spacer structures 197. The chemistry of the anisotropic etch process can be sequentially modified to etch through the various material layers of the first vertical stack (12L, 16L, 14L, 17L).

According to a non-limiting aspect of the present disclosure, the chemistry of the anisotropic etch process can be selected such that the first barrier layer 17L, the first selector layer 14L, the first phase change memory layer 16L, and the first blanket electrically conductive layer 12L are etched to provide sidewalls that are vertical or substantially vertical, i.e., with a taper angle less than 5 degrees from the vertical direction. Each layer within the first vertical stack (12L, 16L, 14L, 17L) can be patterned to provide vertical or substantially vertical sidewalls.

The anisotropic etch process can stop at, or below, the top surface of the substrate 8. Lower first-level trenches 11 laterally extending along the first horizontal direction hd1 are formed by the anisotropic etch. The lower first-level trenches 11 can be line trenches having a uniform vertical cross-sectional shape within vertical planes that are perpendicular to the first horizontal direction hd1. The uniform vertical cross-sectional shape of each lower first-level trench 11 can be invariant with translation along the first horizontal direction hd1. Each lower first-level trench 11 can vertically extend from the horizontal plane including the bottom surface of the first etch mask spacer structures 197 to the horizontal plane including the top surface of the substrate 8. Each lower first-level trench 11 can have a vertical cross-sectional shape of an inverted trapezoid.

Remaining portions of the first vertical stack (12L, 16L, 14L, 17L) include first stacked elongated loop-shaped structures (12' 16', 14', 17'), which have the same shape as the respective overlying etch mask spacer structures 197 (i.e., including line segments located under the line segments 197A of the etch mask spacer structure 197 and including end segments under the end segments 197B of the etch mask spacer structure 197). Each first stacked elongated loop-shaped structure (12' 16', 14', 17') generally laterally extends along the first horizontal direction hd1 (i.e., the line segments of the first stacked elongated loop-shaped structures (12' 16', 14', 17') extend in the first horizontal direction). The first stacked elongated loop-shaped structures (12' 16', 14', 17') are laterally spaced apart by the lower first-level trenches 11 along the second horizontal direction hd2. As used herein, an "elongated loop-shaped" structure refers to a structure that includes a pair of lengthwise line segments that extend along a lengthwise direction and a pair of c-shaped (e.g., curved) end segments that connect ends of the lengthwise line segments in a loop configuration.

Each first stacked elongated loop-shaped structure (12' 16', 14', 17') includes, from bottom to top, a first elongated loop-shaped conductive material portion 12' that is a patterned portion of the first blanket electrically conductive layer 12L, a first elongated loop-shaped phase change memory material portion 16' that is a patterned portion of the first phase change memory layer 16L, a first elongated loop-shaped selector material portion 14' that is a patterned portion of the first selector layer 14L, and a first elongated loop-shaped barrier material portion 17' that is a patterned portion of the first barrier layer 17L. Thus, the first stacked elongated loop-shaped structures (12' 16', 14', 17') laterally extend along the first horizontal direction hd1, are laterally spaced apart from each other by the lower first-level trenches 11, and are located over the substrate 8.

In one embodiment, each first elongated loop-shaped phase change memory material portion 16' can include, from bottom to top, a first optional lower spacer portion 162', a first phase change memory material portion 164', and a first optional upper spacer portion 166'. Each first lower spacer portion 162' is a patterned portion of the first lower conductive liner layer 162L, each first phase change memory material portion 164' is a patterned portion of the first phase change memory material layer 164L, and each first upper spacer portion 166' is a patterned portion of the first upper spacer layer 166L. In one embodiment, each of the first elongated loop-shaped conductive material portions 12 can include a vertical stack of a first metal portion 122 that is a patterned portion of the first metal layer 122L and a first electrode buffer portion 124 that is a patterned portion of the first electrode buffer layer 124L. The first stacked elongated loop-shaped structures (12' 16', 14', 17') laterally extend along the first horizontal direction hd1, and are laterally spaced among one another by the lower first-level trenches 11 over the substrate 8. The first etch mask spacer structures 197 can be subsequently removed, for example, by ashing if they comprise photoresist or another polymer material, or by selective etching if they comprise a non-polymer material.

Each of the first elongated loop-shaped conductive material potions 12' includes a respective pair of first line segments and a respective pair of first c-shaped connecting end segments adjoined to ends of the respective pair of first line segments. Each of the first line segments laterally extends along the first horizontal direction hd1 with a first uniform width, which may be a sub-lithographic dimension, i.e., a dimension that is less than the minimum dimension that can be patterned with a single lithographic exposure and development process. In one embodiment, the first elongated loop-shaped conductive material portions 12' are formed as a periodic one-dimensional array having the same pitch as the first template line structures 193 along the second horizontal direction hd2.

Figure 6A:
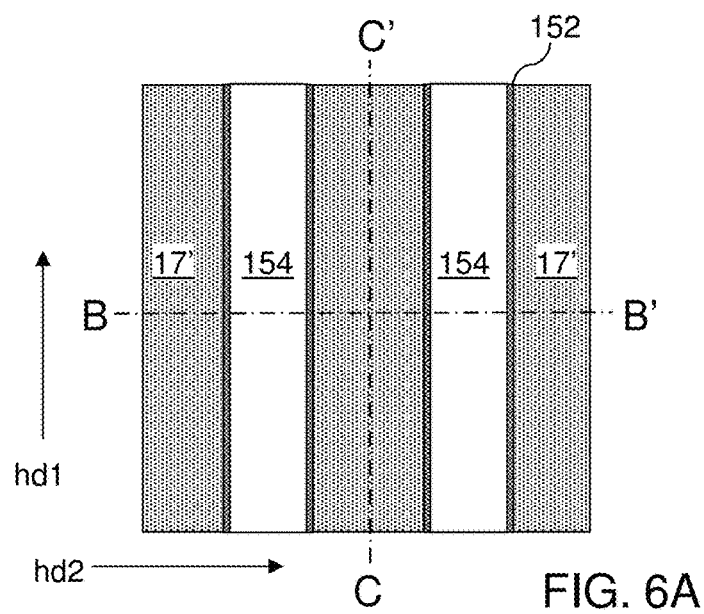
FIG. 6A is a top-down view of a region of the exemplary structure after formation of lower first-level dielectric isolation structures according to an embodiment of the present disclosure.
Figures 6B, 6C:
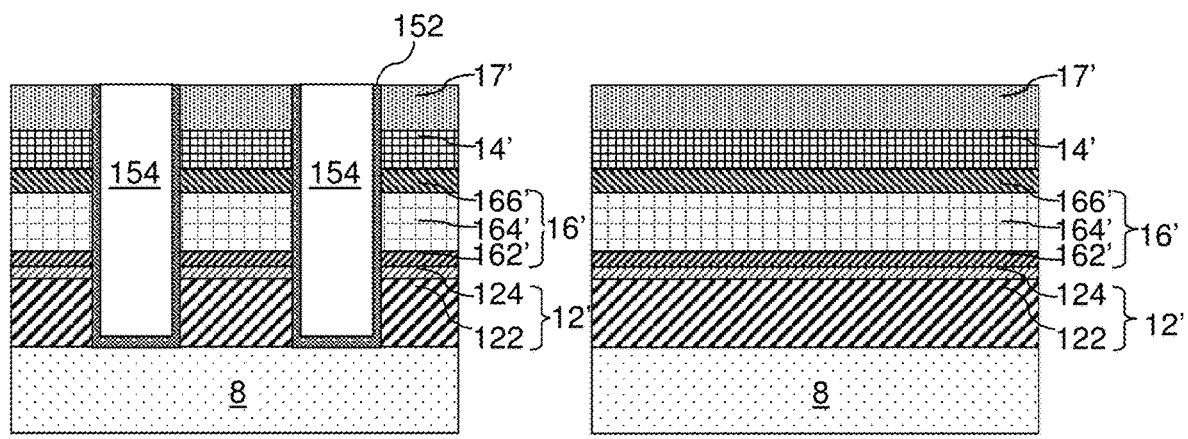
FIG. 6B is a vertical cross-sectional view of the exemplary structure along the vertical plane B-B' of FIG. 6A.
FIG. 6C is a vertical cross-sectional view of the exemplary structure along the vertical plane C-C' of FIG. 6A.

Referring to FIGS. 6A-6C, a lower first-level continuous dielectric liner can be optionally deposited on sidewalls and bottom surfaces of the lower first-level trenches 11 and over the first elongated loop-shaped barrier material portions 17'. The lower first-level continuous dielectric liner includes a dielectric material such as silicon nitride, a dielectric metal oxide (such as aluminum oxide), or silicon oxide. The lower first-level continuous dielectric liner can be deposited by a conformal deposition method such as chemical vapor deposition (CVD) or atomic layer deposition (ALD). The thickness of the lower first-level continuous dielectric liner can be in a range from 1 nm to 10 nm, such as from 2 nm to 6 nm, although lesser and greater thicknesses can also be employed.

A lower first-level dielectric fill material layer can be deposited on the lower first-level continuous dielectric liner. The lower first-level dielectric fill material layer includes a planarizable dielectric material such as undoped silicate glass (e.g., silicon oxide), doped silicate glass, or a spin-on glass (SOG). The lower first-level dielectric fill material layer can be deposited by a conformal deposition method or by a self-planarizing deposition method (such as spin coating). In one embodiment, the lower first-level continuous dielectric liner can include, and/or can consist essentially of, a material selected from silicon nitride and a dielectric metal oxide, and the lower first-level dielectric fill material layer can include, and/or can consist essentially of, a material selected from doped silicate glass and undoped silicate glass.

Portions of the lower first-level continuous dielectric liner and the lower first-level dielectric fill material layer can be removed from above the horizontal plane including top surfaces of the first elongated loop-shaped barrier material portions 17' by a planarization process. The planarization process can include chemical mechanical planarization (CMP) and/or a recess etch process. Each remaining portion of the lower first-level continuous dielectric liner constitutes a lower first-level dielectric liner 152, and each remaining portion of the lower first-level dielectric fill material layer constitutes a lower first-level dielectric fill material portion 154. Each contiguous set of a lower first-level dielectric liner 152 and a lower first-level dielectric fill material portion 154 constitutes a lower first-level dielectric isolation structure (152, 154), which is a dielectric isolation structure having straight lengthwise sidewalls. A lower first-level dielectric isolation structure (152, 154) is formed in each of the lower first-level trenches 11. The lower first-level dielectric isolation structures (152, 154) laterally extend along the first horizontal direction hd1, and are laterally spaced among one another along the second horizontal direction hd2. The top surfaces of the lower first-level dielectric isolation structures (152, 154) can be coplanar with the top surfaces of the first elongated loop-shaped barrier material portions 17'.

Figure 7A:
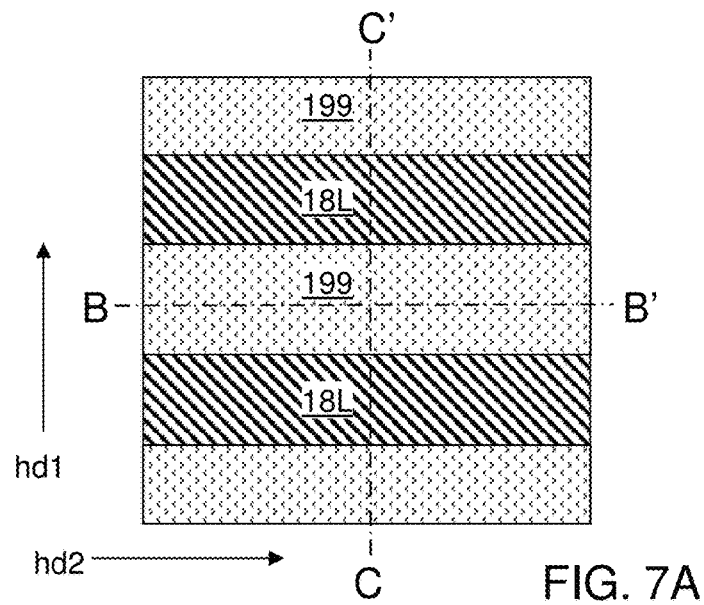
FIG. 7A is a top-down view of a region of the exemplary structure after formation of a second lower blanket electrically conductive layer and second etch mask spacer structures according to an embodiment of the present disclosure.
Figure 7B:
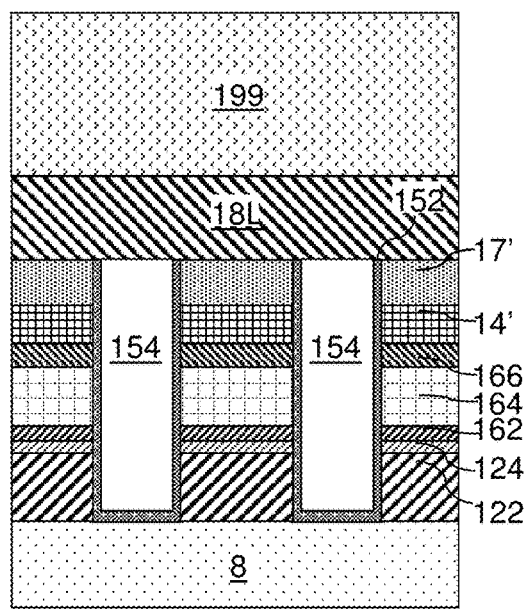
FIG. 7B is a vertical cross-sectional view of the exemplary structure along the vertical plane B-B' of FIG. 7A.
Figure 7C:
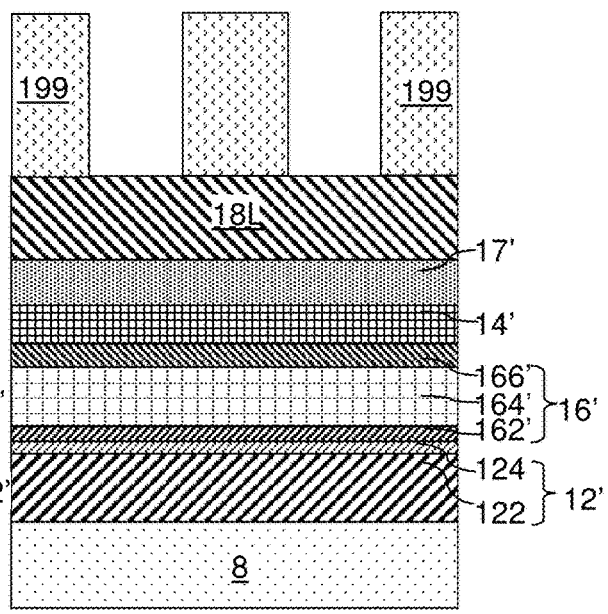
FIG. 7C is a vertical cross-sectional view of the exemplary structure along the vertical plane C-C' of FIG. 7A.

Referring to FIGS. 7A-7C, a second lower blanket electrically conductive layer 18L can be formed over the one-dimensional array of first stacked elongated loop-shaped structures (12' 16', 14', 17') spaced by the lower first-level dielectric isolation structures (152, 154). The second lower blanket electrically conductive layer 18L includes at least one conductive material layer, which can be at least one metallic material layer. For example, the second lower blanket electrically conductive layer 18L can include a metal layer (such as a tungsten layer) or a metal nitride layer (e.g., TiN or W) or two or more separate electrically conductive layers. The thickness of the second lower blanket electrically conductive layer 18L can be in a range from 20 nm to 100 nm, such as from 30 nm to 70 nm, although lesser and greater thicknesses can also be employed. The width of the second lower blanket electrically conductive layer 18L can be in a range from 1 nm to 10 nm, such as from 1.5 nm to 5 nm, although lesser and greater thicknesses can also be employed.

Second template line structures (not shown) extending along the second direction can be formed over the second lower blanket electrically conductive layer 18L by performing the processing steps of FIGS. 2A and 2B with a 90 degree rotation in the pattern. Subsequently, second etch mask spacers 199 that extend along the second horizontal direction hd2 can be formed by performing the processing steps of FIGS. 2A, 2B, 3A, and 3B. Second etch mask spacers 199 having a line and space pattern can be formed over the second lower blanket electrically conductive layer 18L. Each second etch mask spacer 199 laterally surrounds a respective one of the second template line structures.

In one embodiment, the lengthwise portions of the second etch mask spacers 199 that extend along the second horizontal direction hd2 have a same center-to-center distance throughout, which can be the same as one half of the pitch of the second template line structures. Thus, pitch doubling can be achieved for the lengthwise portions of the second etch mask spacers 199 relative to the pitch of the second template line structures. The second template line structure can be subsequently removed selective to the second etch mask spacers 199, which have the loop structure similar to those of the first etch mask spacers 197, but which extend in the second horizontal direction hd2 instead of the first horizontal direction hd1.

Referring to FIGS. 8A-8C, upper first-level trenches 15 are formed through the second lower blanket electrically conductive layer 18L, the first stacked elongated loop-shaped structures (12' 16', 14', 17'), and the lower first-level dielectric isolation structures (152, 154). An anisotropic etch process can be performed to etch portions of the second lower blanket electrically conductive layer 18L, the first elongated loop-shaped barrier material portions 17', the first elongated loop-shaped selector material portions 14', the first elongated loop-shaped phase change memory material portions 16', and upper regions of the lower first-level dielectric isolation structures (152, 154) that are not masked by the second etch mask spacers 199. The materials of the second lower blanket electrically conductive layer 18L, the first elongated loop-shaped barrier material portions 17', the first elongated loop-shaped selector material portions 14', the first elongated loop-shaped phase change memory material portions 16', and the lower first-level dielectric isolation structures (152, 154) can be etched selective to the material in the top portions of the first elongated loop-shaped conductive material portions 12 by the anisotropic etch process. Volumes from which the materials of the second lower blanket electrically conductive layer 18L, the first elongated loop-shaped barrier material portions 17', the first elongated loop-shaped selector material portions 14', the first elongated loop-shaped phase change memory material portions 16', and upper regions of the lower first-level dielectric isolation structures (152, 154) are removed constitute the upper first-level trenches 15. The upper first-level trenches 15 laterally extend along the second horizontal direction hd2.

The chemistry of the anisotropic etch process can be sequentially modified to etch through the various materials of the second lower blanket electrically conductive layer 18L, the first elongated loop-shaped barrier material portions 17', the first elongated loop-shaped selector material portions 14', the first elongated loop-shaped phase change memory material portions 16', and the lower first-level dielectric isolation structures (152, 154). The anisotropic etch process can stop at the top surface of, or within, the first elongated loop-shaped conductive material portions 12. For example, the anisotropic etch process can stop on the first electrode buffer portions 124. The upper first-level trenches 15 can be line trenches having a uniform vertical cross-sectional shape within vertical planes that are perpendicular to the second horizontal direction hd2. The uniform vertical cross-sectional shape of each upper first-level trench 15 can be invariant with translation along the second horizontal direction hd2. Each upper first-level trench 15 can vertically extend from the horizontal plane including the bottom surface of the second etch mask spacers 199 to the horizontal plane including top surfaces of the first elongated loop-shaped conductive material portions 12 (which can be word lines for example).

The second lower blanket electrically conductive layer 18L is divided into a one-dimensional array of elongated loop-shaped conductive material portions, which are herein referred to as second elongated loop-shaped conductive material portions 18' (which can be portions of bit lines for example). Each second elongated loop-shaped conductive material portion 18' is subsequently incorporated into a respective second elongated loop-shaped conductive material portion that includes a respective upper second elongated loop-shaped conductive material portion to be subsequently formed thereabove.

Each vertical stack of a first elongated loop-shaped barrier material portion 17', a first elongated loop-shaped phase change memory material portions 16', and a first elongated loop-shaped selector material portions 14' is divided into two rows of first memory pillar structures (16, 14, 17) that are laterally spaced apart long the first horizontal direction hd1. The combination of the first elongated loop-shaped barrier material portions 17', the first elongated loop-shaped phase change memory material portions 16', and the first elongated loop-shaped selector material portions 14' is divided into a two-dimensional array of first memory pillar structures (16, 14, 17), which may be a periodic two-dimensional array. The two-dimensional array of first memory pillar structures (16, 14, 17) can form a rectangular periodic two-dimensional array having a first pitch along the first horizontal direction hd1 and a second pitch along the second horizontal direction hd2.

As used herein, a "pillar" or a "pillar structure" refers to a structure that extends along a vertical direction. Sidewalls of a pillar structure may be vertical or substantially vertical. As used herein, a sidewall is "substantially vertical" if the sidewall is tapered, i.e., tilted, with respect to a vertical direction by a tilt angle that is less than 5 degrees.

Each first memory pillar structure (16, 14, 17) includes, from bottom to top, a first phase change memory pillar structure 16 that is a patterned portion of an elongated loop-shaped phase change memory material portion 16', a first selector pillar 14 that is a patterned portion of a first elongated loop-shaped selector material portion 14', and an optional first barrier plate 17 that is a patterned portion of a first barrier portion 17'. As used herein, a "plate" refers to a structure with a vertical thickness (such as a uniform vertical thickness) that is less than the maximum lateral dimension of the structure in any horizontal direction.

Each first phase change memory pillar structure 16 is a phase change memory element, i.e., a structure that changes the resistance depending on the phase of a material therein. In one embodiment, each first phase change memory pillar structure 16 can include a vertical stack of an optional first lower spacer plate 162 that is a patterned portion of a first optional lower spacer portion 162', a first phase change memory material pillar 164 that is a patterned portion of a first phase change memory material portion 164', and a first optional upper spacer plate 166 that is a patterned portion of a first upper spacer portion 166'. In one embodiment, each sidewall of the first phase change memory material pillars 164 may be vertical or substantially vertical.

Each first selector pillar 14 is a selector element, i.e., an element that provides non-linear voltage-current characteristics such that the element functions as a conductor under first voltage bias conditions and as an insulator under second voltage bias conditions. In one embodiment, each first selector pillar 14 can include a first ovonic threshold switch material portion 14 that is a patterned portion of a first ovonic threshold switch material portion 14'.

Each lower first-level dielectric isolation structure (152, 154) has a laterally undulating height after the anisotropic etch process. Specifically, the height of each lower first-level dielectric isolation structure (152, 154) can be the same as the total thickness of a first stacked elongated loop-shaped structure (12' 16', 14', 17') as provided at the processing steps of FIGS. 4A-4C underneath each portion of the second etch mask spacers 199, and can be about the same as the height (i.e., the thickness) of a first elongated loop-shaped conductive material portion 12' underneath each upper first-level trench 15. Each lower first-level dielectric isolation structure (152, 154) can continuously extend underneath a plurality of upper first-level trenches 15.

Figure 5B:
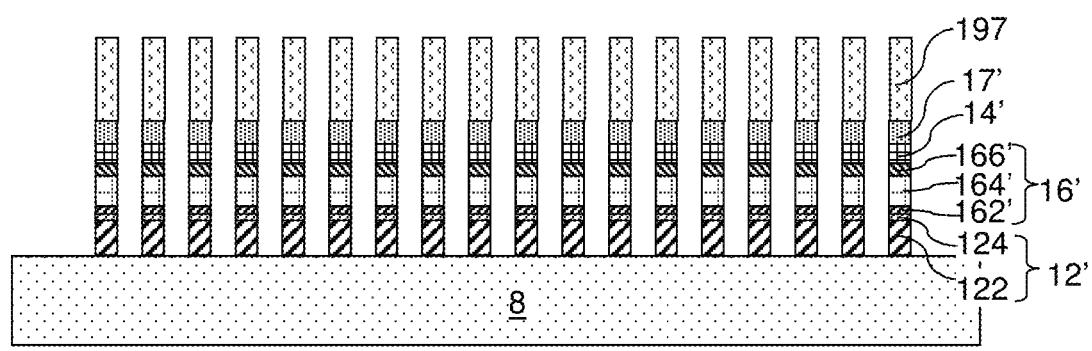
FIG. 5B is a vertical cross-sectional view of the exemplary structure along the vertical plane B-B' of FIG. 5A.
Figure 5D:
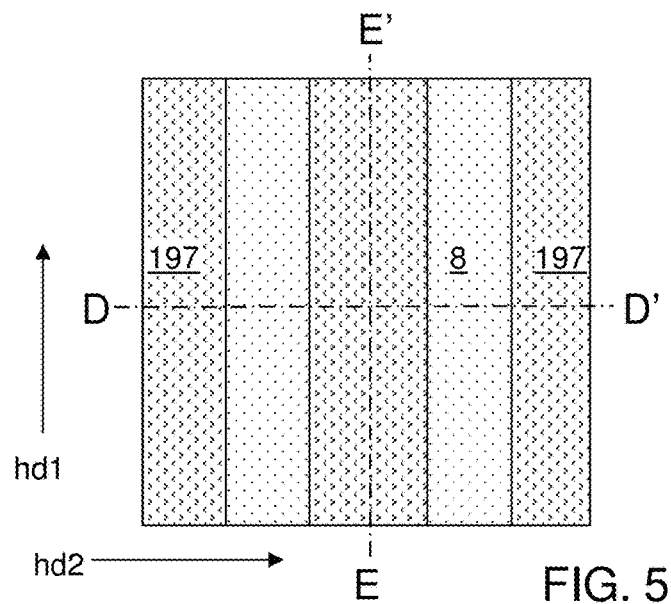
FIG. 5D is a vertical cross-sectional view of the exemplary structure along the vertical plane D-D' of FIG. 5C.
Figure 5E:
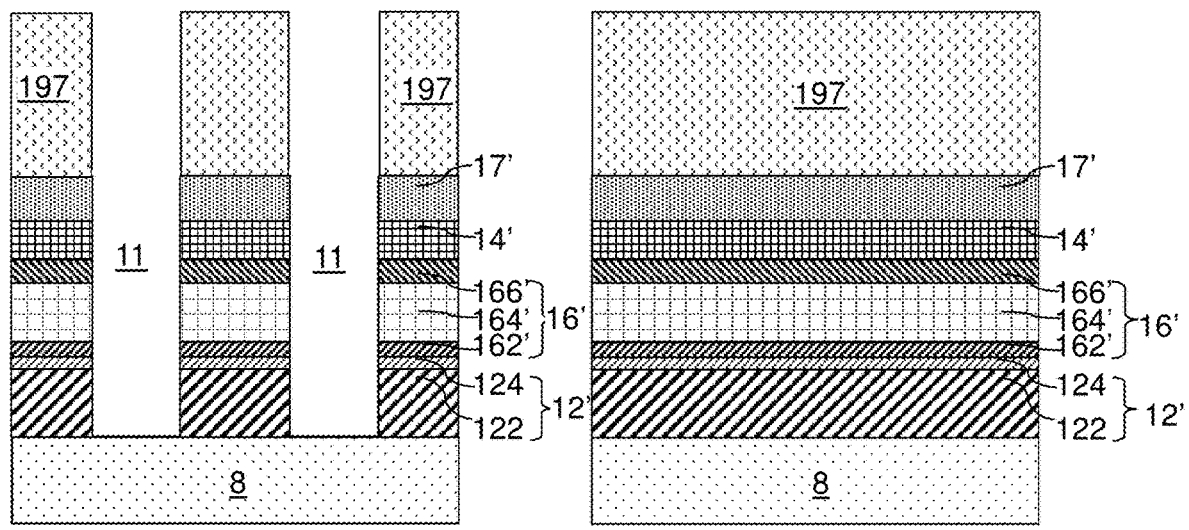
FIG. 5E is a vertical cross-sectional view of the exemplary structure along the vertical plane E-E' of FIG. 5C.

The first barrier plates 17 are barrier elements, and can be arranged in a two-dimensional periodic array. While FIGS. 5A-5C illustrate an embodiment in which a first phase change memory pillar structure 16 underlies a first selector pillar 14 within each first memory pillar structure (16, 14, 17), embodiments are expressly contemplated herein in which a first phase change memory pillar structure 16 overlies a first selector pillar 14 within each first memory pillar structure (16, 14, 17). In each case, if a first barrier plate 17 is present within a first memory pillar structure (16, 14, 17), a two-dimensional array of barrier elements (i.e., first barrier plates 17) may be disposed between the first phase change memory elements (i.e., the first phase change memory pillar structures 16) and a proximal set among a set of the first elongated loop-shaped conductive material portions 12 and a set of the second elongated loop-shaped conductive material portions 18'.

Figure 9D:
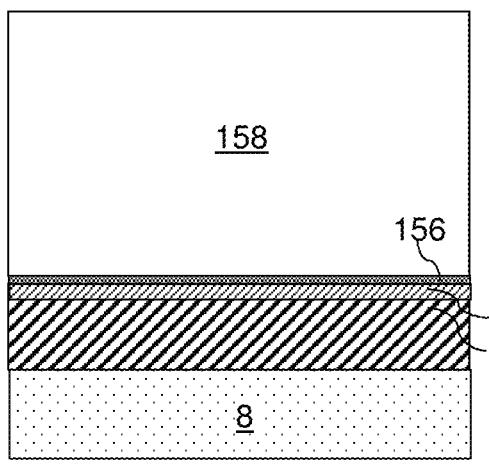
FIG. 9D is a vertical cross-sectional view of the exemplary structure along the vertical plane D-D' of FIG. 9A.
Figure 9E:
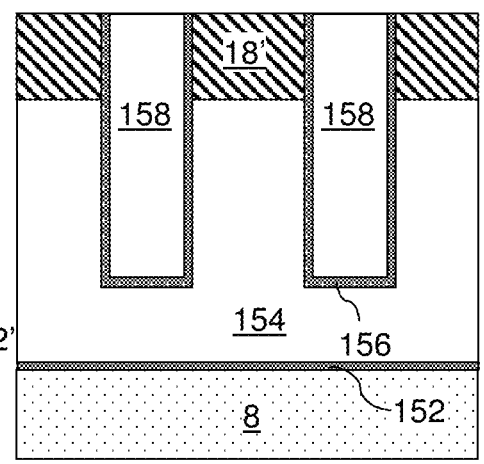
FIG. 9E is a vertical cross-sectional view of the exemplary structure along the vertical plane E-E' of FIG. 9A.
Figure 9F:
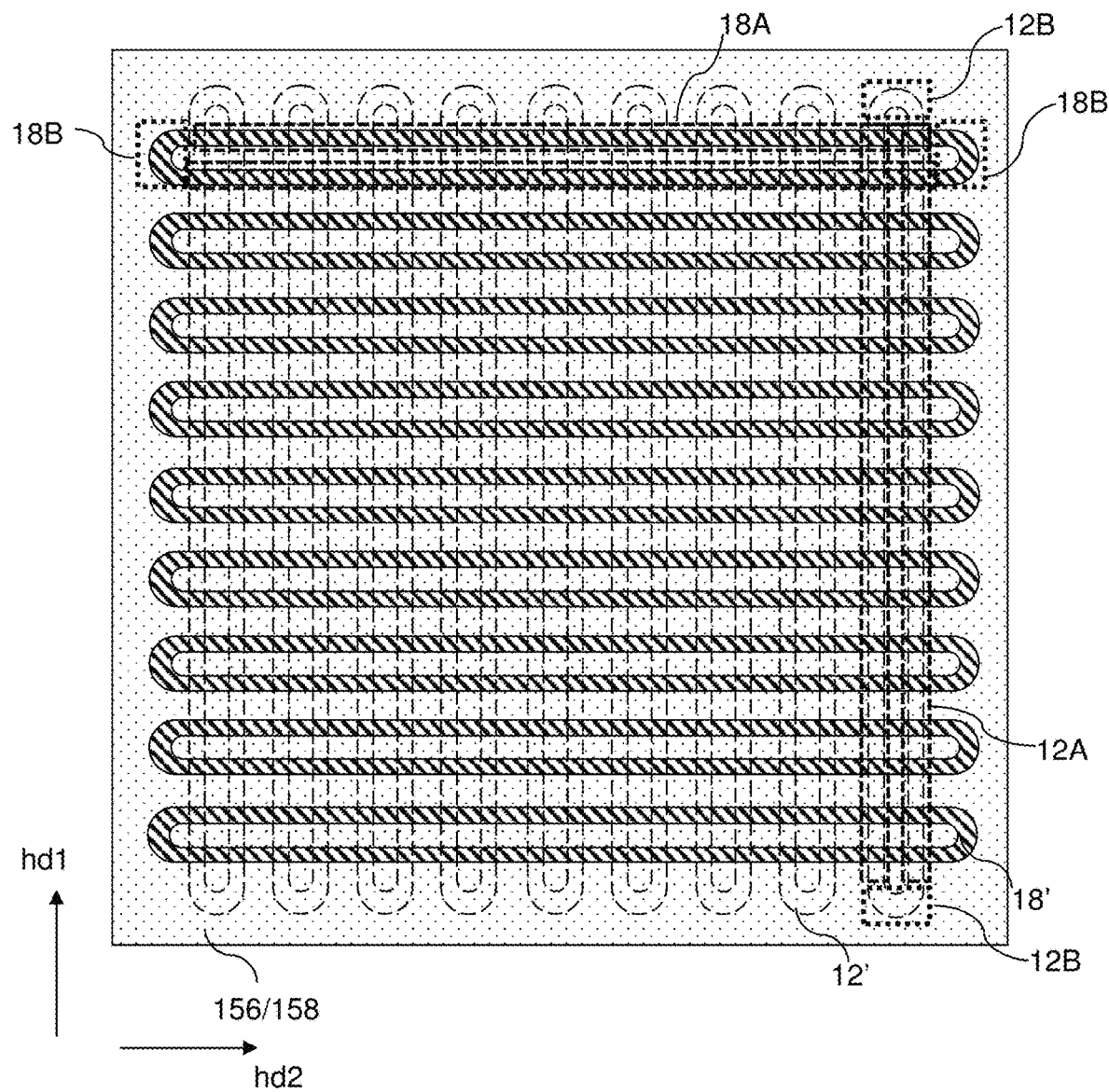
FIG. 9F is a partial see-through top-down view of the exemplary structure at the processing steps of FIGS. 9A-9E.
Figure 10A:
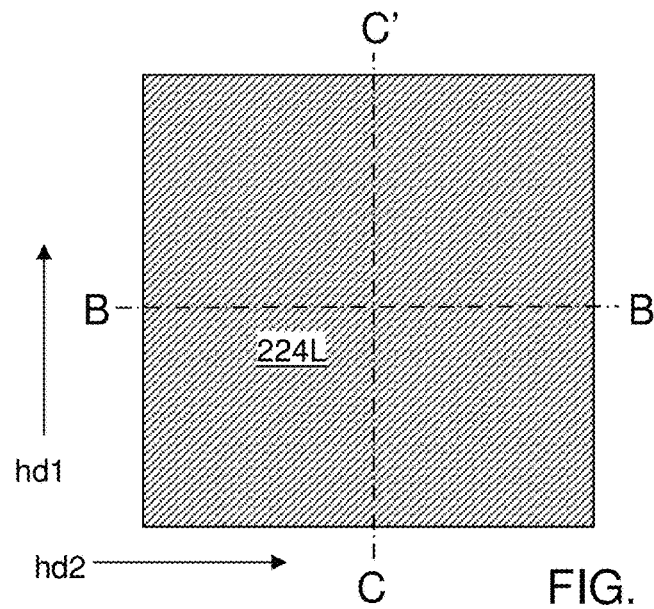
FIG. 10A is a top-down view of a region of the exemplary structure after formation of a second upper blanket electrically conductive layer according to an embodiment of the present disclosure.
Figure 10B:
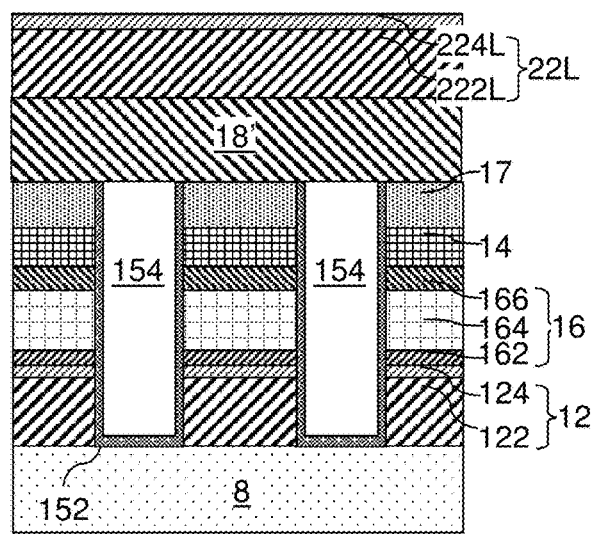
FIG. 10B is a vertical cross-sectional view of a region of the exemplary structure along the vertical plane B-B' of FIG. 10A.
Figure 10C:
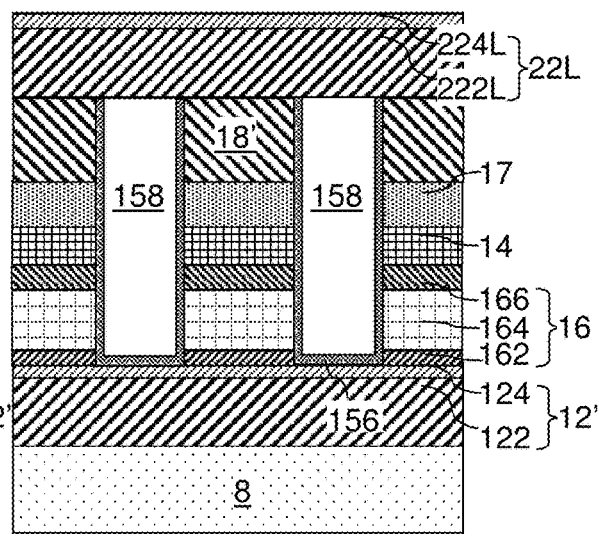
FIG. 10C is a vertical cross-sectional view of the exemplary structure along the vertical plane C-C' of FIG. 10A.
Figure 10D:
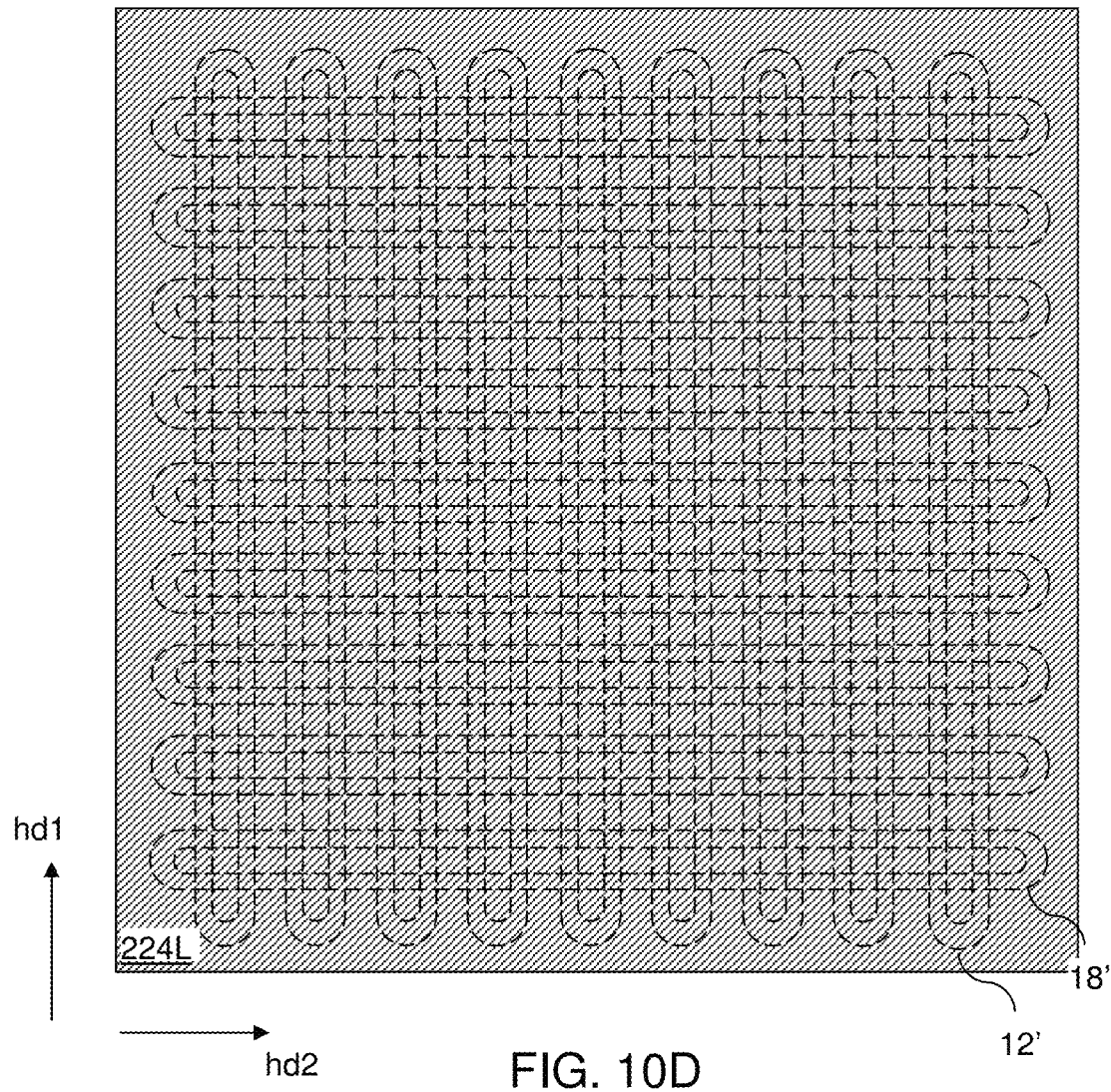
FIG. 10D is a partial see-through top-down view of the exemplary structure of FIGS. 10A-10C.

Referring to FIGS. 9A-9F, the second etch mask spacers 199 can be subsequently removed, for example, by ashing or selective etching. An upper first-level continuous dielectric liner can be optionally deposited on sidewalls and bottom surfaces of the upper first-level trenches 15 and over the second elongated loop-shaped conductive material portions 18'. The upper first-level continuous dielectric liner includes a dielectric material such as silicon nitride, a dielectric metal oxide (such as aluminum oxide), or silicon oxide. The upper first-level continuous dielectric liner can be deposited by a conformal deposition method such as chemical vapor deposition (CVD) or atomic layer deposition (ALD). The thickness of the upper first-level continuous dielectric liner can be in a range from 1 nm to 10 nm, such as from 2 nm to 6 nm, although lesser and greater thicknesses can also be employed. As shown in FIG. 9F, the first elongated loop-shaped conductive material portions 12' include line segments 12A and c-shaped (e.g., curved) end segments 12B. The second elongated loop-shaped conductive material portions 18' include line segments 18A and c-shaped (e.g., curved) end segments 18B.

An upper first-level dielectric fill material layer can be deposited on the upper first-level continuous dielectric liner. The upper first-level dielectric fill material layer includes a planarizable dielectric material such as undoped silicate glass (e.g., silicon oxide), doped silicate glass, or a spin-on glass (SOG). The upper first-level dielectric fill material layer can be deposited by a conformal deposition method or by a self-planarizing deposition method (such as spin coating). In one embodiment, the upper first-level continuous dielectric liner can include, and/or can consist essentially of, a material selected from silicon nitride and a dielectric metal oxide, and the upper first-level dielectric fill material layer can include, and/or can consist essentially of, a material selected from doped silicate glass and undoped silicate glass.

Portions of the upper first-level continuous dielectric liner and the upper first-level dielectric fill material layer can be removed from above the horizontal plane including top surfaces of the second elongated loop-shaped conductive material portions 18' by a planarization process. The planarization process can include chemical mechanical planarization (CMP) and/or a recess etch process. Each remaining portion of the upper first-level continuous dielectric liner constitutes an upper first-level dielectric liner 156, and each remaining portion of the upper first-level dielectric fill material layer constitutes an upper first-level dielectric fill material portion 158. Each contiguous set of an upper first-level dielectric liner 156 and an upper first-level dielectric fill material portion 158 constitutes an upper first-level dielectric isolation structure (156, 158), which is a dielectric isolation structure having straight lengthwise sidewalls. The upper first-level dielectric isolation structure (156, 158) is formed in each of the upper first-level trenches 15. The upper first-level dielectric isolation structures (156, 158) laterally extend along the second horizontal direction hd2, and are laterally spaced among one another along the first horizontal direction hd1. The top surfaces of the upper first-level dielectric isolation structures (156, 158) can be coplanar with the top surfaces of the second elongated loop-shaped conductive material portions 18'.

The set of all structures above the horizontal plane including the top surface of the substrate 8 constitutes a first-level structure that includes a first two-dimensional array of first memory pillar structures (16, 14, 17). The combination of the lower first-level dielectric isolation structures (152, 154) and the upper first-level dielectric isolation structures (156, 158) constitutes a first dielectric matrix (152, 154, 156, 158) that around the first two-dimensional array of first memory pillar structures (16, 14, 17). The second elongated loop-shaped conductive material portions 18' are formed within an upper region of the first dielectric matrix (152, 154, 156, 158).

Referring to FIGS. 10A-10D, an electrically conductive material layer is formed on top surfaces of the second elongated loop-shaped conductive material portions 18'. The electrically conductive material layer can be deposited as a blanket material layer, and is herein referred to as a second upper blanket electrically conductive layer 22L. The second upper blanket electrically conductive layer 22L includes at least one conductive material layer, which can be at least one metallic material layer. For example, the second upper blanket electrically conductive layer 22L can include a layer stack including, from bottom to top, a second metal layer 222L (such as a tungsten layer) and a second electrode buffer layer 224L (such as a tungsten nitride layer, a titanium nitride layer, a carbon layer, or combination thereof). The thickness of the second metal layer 222L can be in a range from 20 nm to 100 nm, such as from 30 nm to 70 nm, although lesser and greater thicknesses can also be employed. The thickness of the second electrode buffer layer 224L can be in a range from 1 nm to 10 nm, such as from 1.5 nm to 5 nm, although lesser and greater thicknesses can also be employed.

Figure 11A:
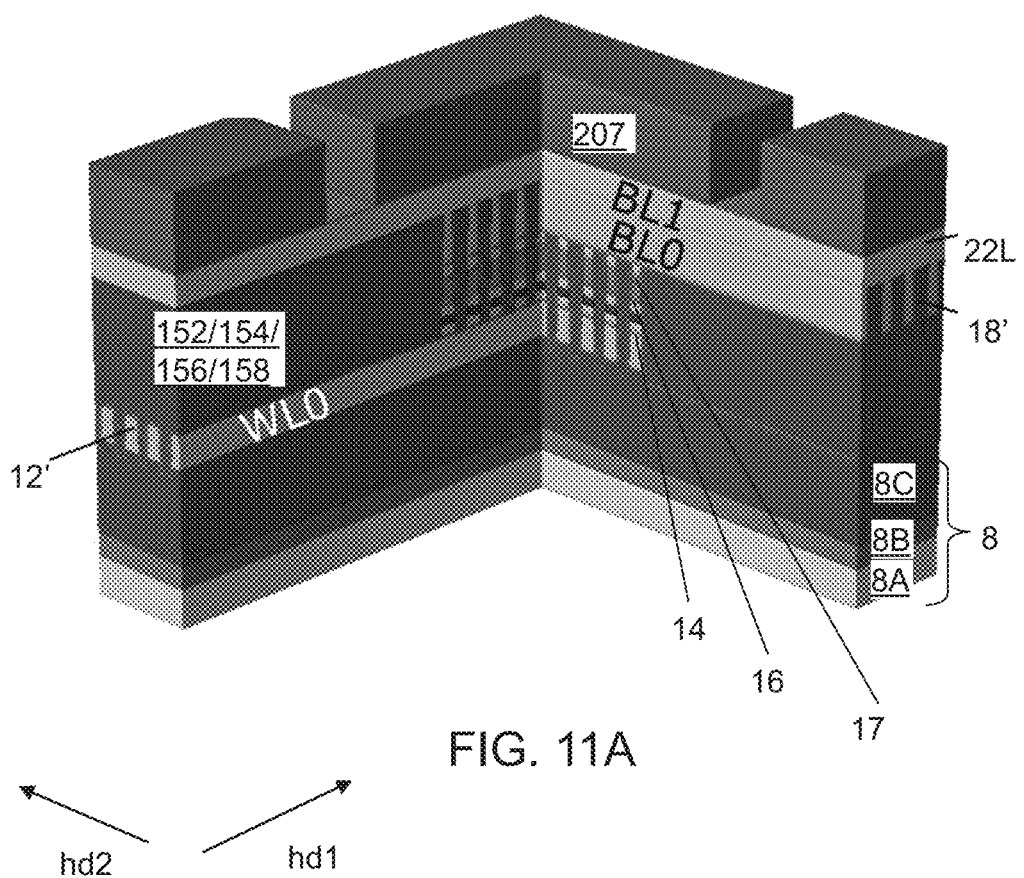
FIGS. 11A-11C are sequential perspective views of a cut-out portion of the exemplary structure during formation of a first moat trench and a first dielectric moat trench fill structure according to an embodiment of the present disclosure.
Figure 11B:
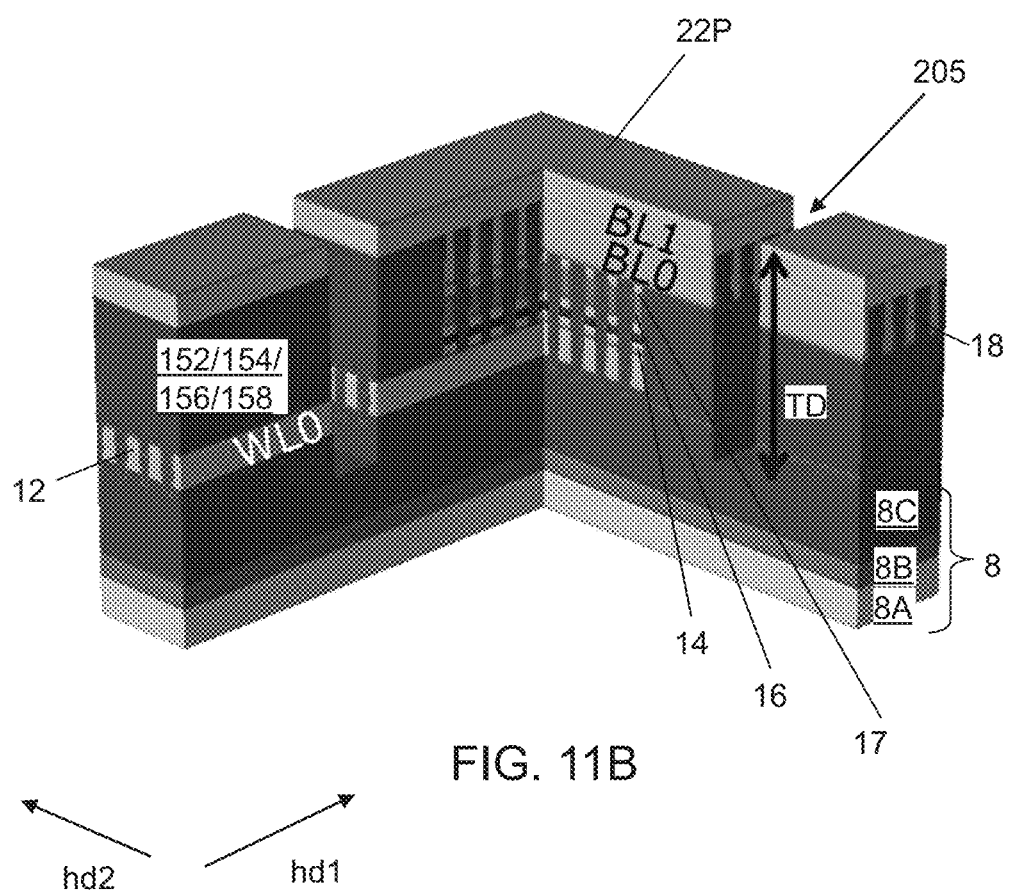
Figure 11C:
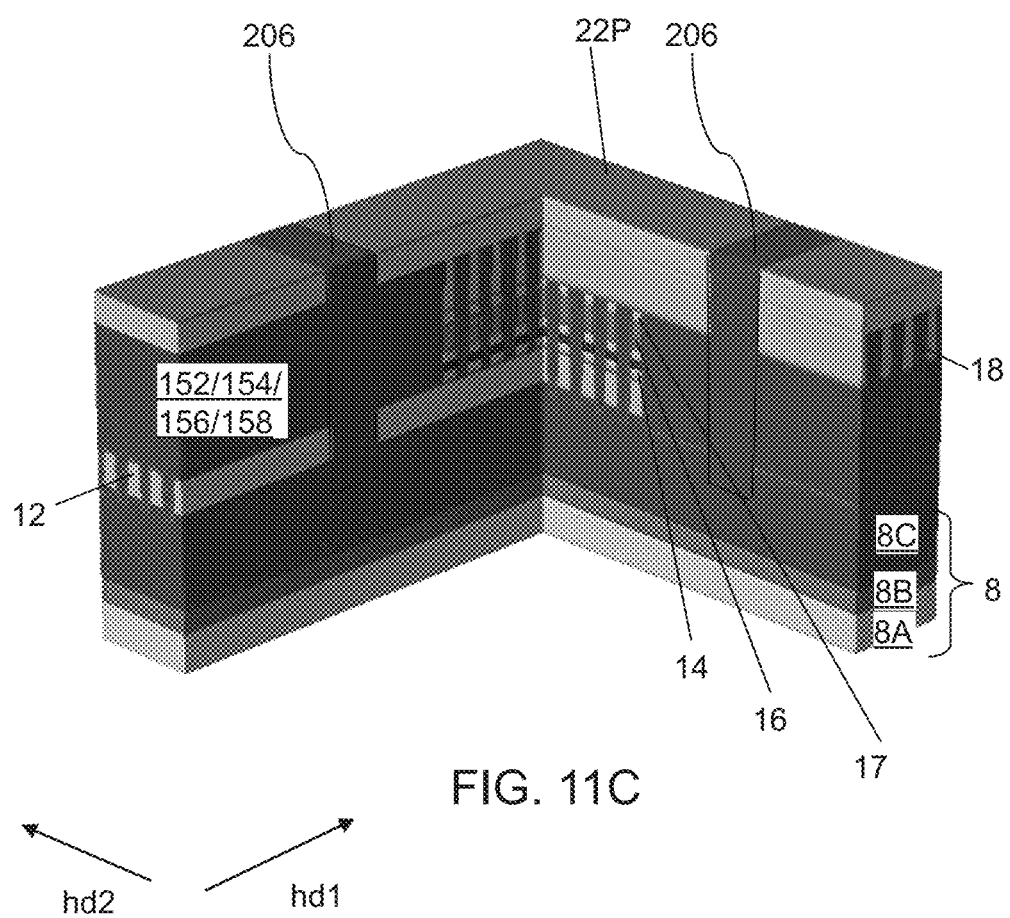

FIGS. 11A-11C are sequential perspective views of a cut-out portion of the exemplary structure during formation of the first moat trench and a first dielectric moat trench fill structure 206 during simultaneous word line and bit line loop cut process according to an embodiment of the present disclosure. In one embodiment, the first elongated loop-shaped conductive material potions 12' comprise precursor structures for forming first word lines, and the second elongated loop-shaped conductive material portion portions 18' comprise precursor structures for forming first bit lines.

Referring to FIGS. 11A and 12A-12C, a patterned etch mask layer 207 is formed over the second upper blanket electrically conductive layer 22L within an area that covers an entirety of the first two-dimensional array of first memory pillar structures (16, 14, 17). C-shaped end segments of the first elongated loop-shaped conductive material potions 12' and c-shaped end segments of the second elongated loop-shaped conductive material portion portions 18' are not covered by the patterned etch mask layer 207. In one embodiment, the patterned etch mask layer 207 comprises a lithographically patterned photoresist layer having a rectangular horizontal cross-sectional shape. The substrate 8 may include a stack of material layers, which may include, for example, a semiconductor substrate (e.g., silicon wafer) 8A, a device layer 8B including various peripheral (e.g., driver circuit) semiconductor devices, such as field effect transistors, and an interconnect dielectric layer 8C including dielectric material layers embedding metal interconnect structures.

Figure 12A:
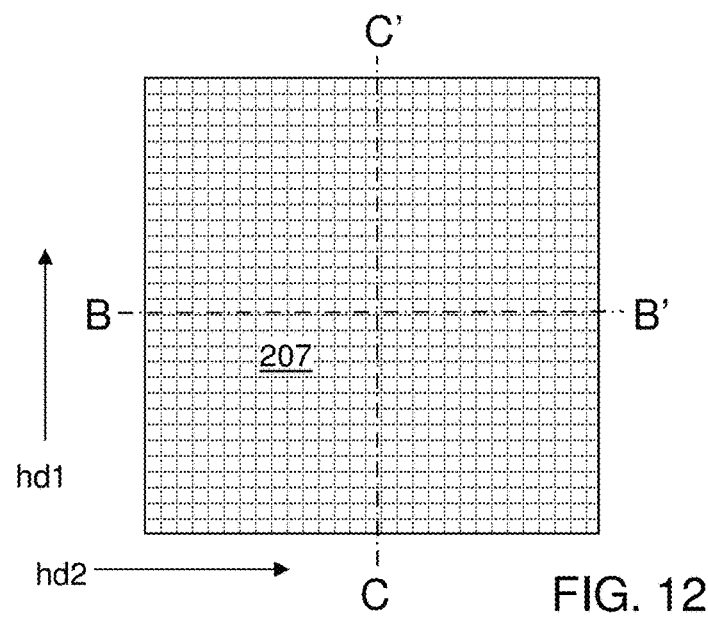
FIG. 12A is a top-down view of a region of the exemplary structure of FIG. 11A after formation of a patterned etch mask layer over the second upper blanket electrically conductive layer according to an embodiment of the present disclosure.
Figures 12B, 12C:
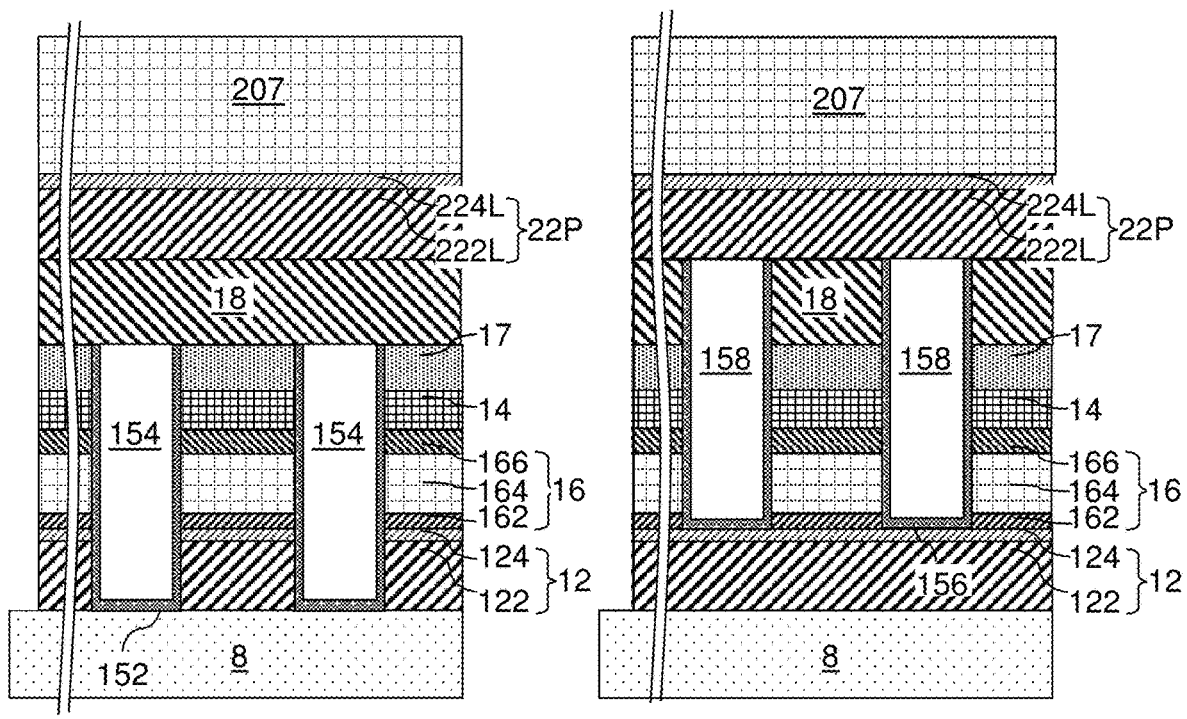
FIG. 12B is a vertical cross-sectional view of the exemplary structure along the vertical plane B-B' of FIG. 12A.
FIG. 12C is a vertical cross-sectional view of the exemplary structure along the vertical plane C-C' of FIG. 12A.
Figure 12D:
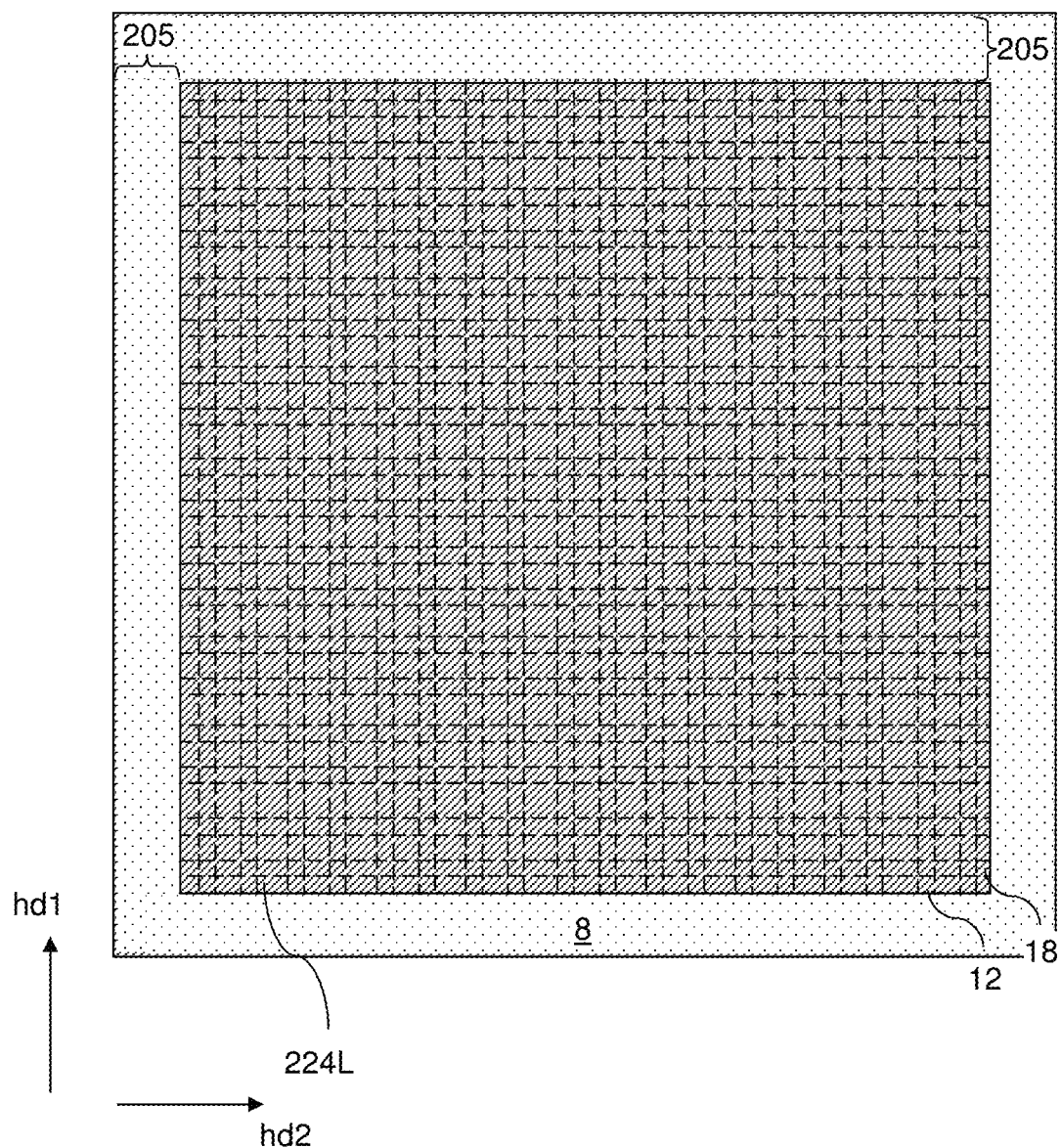
FIG. 12D is a partial see-through top-down view of the exemplary structure of FIG. 11B.
Figure 13B:
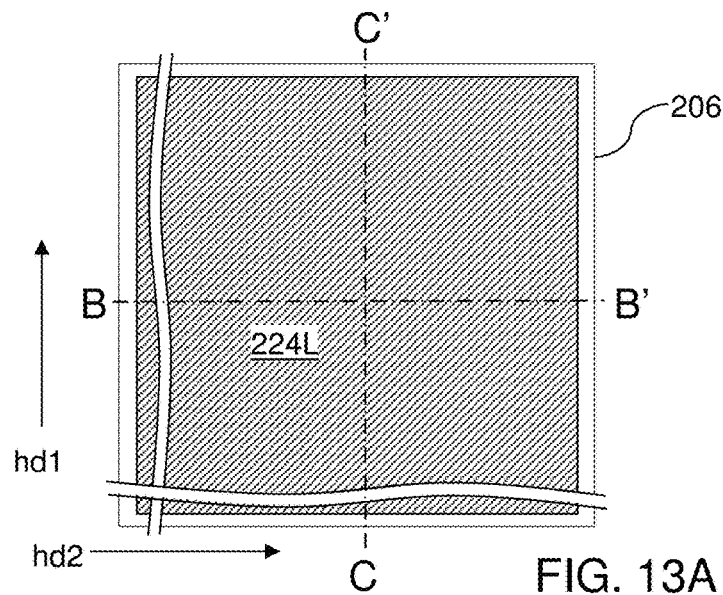
FIG. 13B is a vertical cross-sectional view of a region of the exemplary structure along the vertical plane B-B' of FIG. 13A.
Figure 13C:
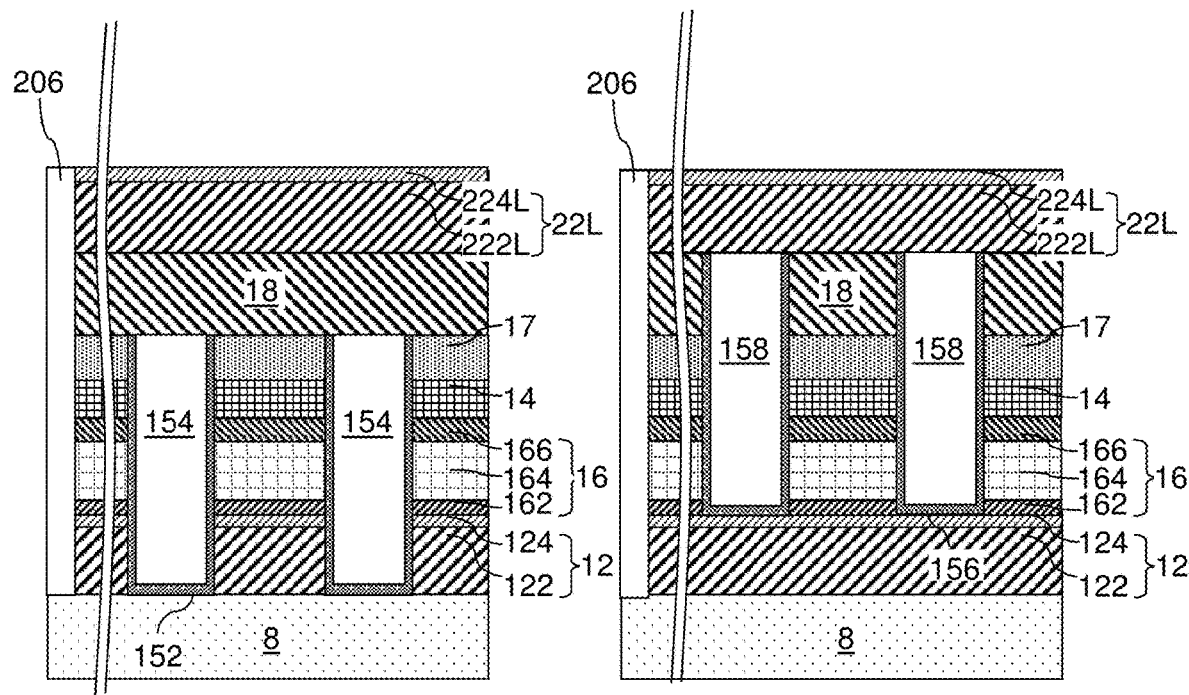
FIG. 13C is a vertical cross-sectional view of the exemplary structure along the vertical plane C-C' of FIG. 13A.
Figure 13D:
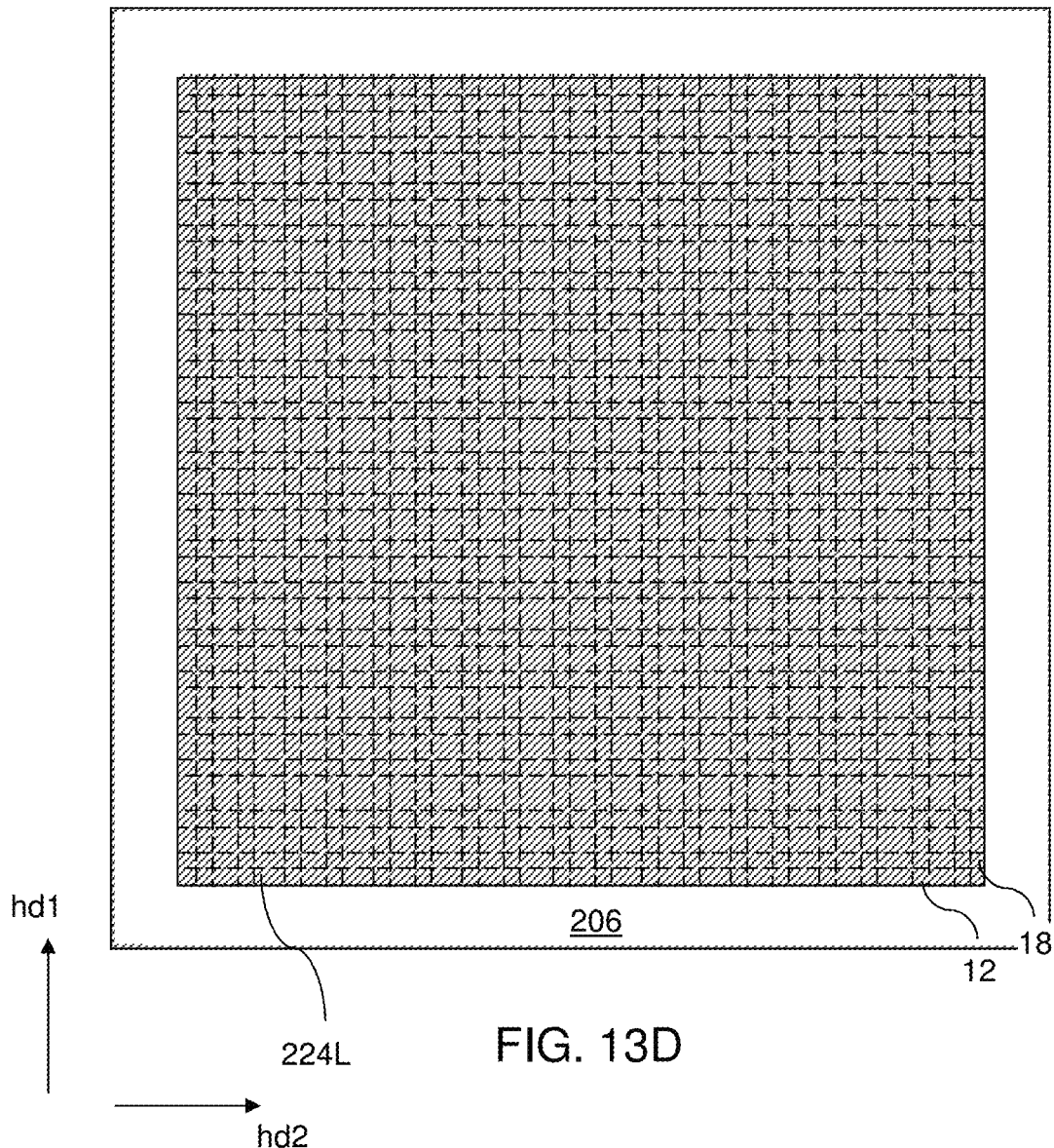
FIG. 13D is a top-down view of the exemplary structure of FIGS. 13A-13C.
Figure 13E:
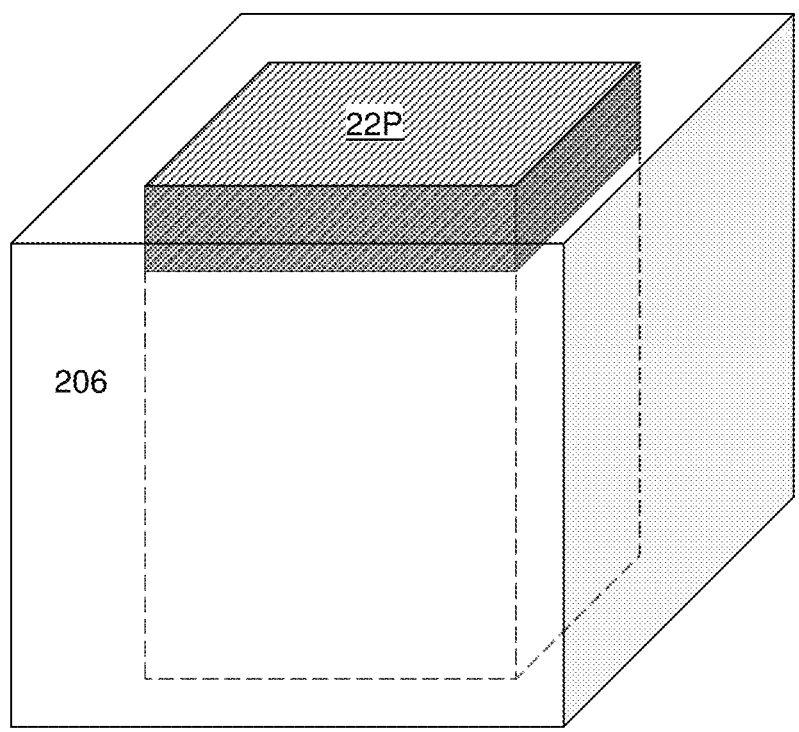
FIG. 13E is a perspective view of the exemplary structure of FIGS. 13A-13D.
Figure 14D:
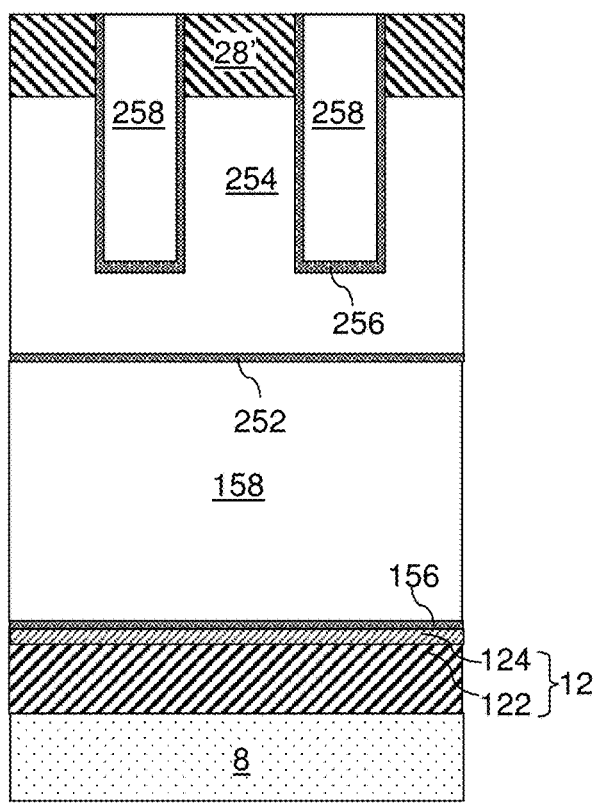
FIG. 14D is a vertical cross-sectional view along the vertical plane D-D' of FIG. 14A.
Figure 14E:
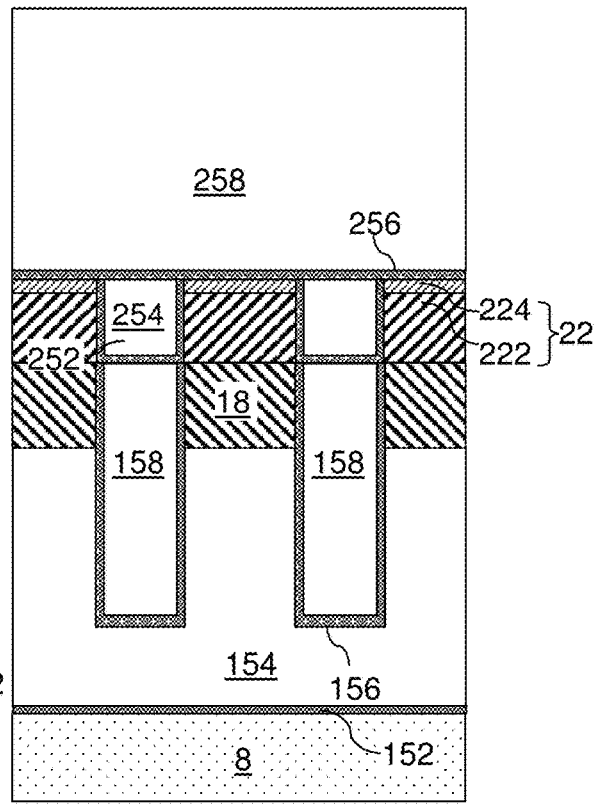
FIG. 14E is a vertical cross-sectional view along the vertical plane E-E' of FIG. 14A.

Referring to FIGS. 11B and 12D, an anisotropic etch process is performed to etch through material portions that are not masked by the patterned etch mask layer 207 and are located above the horizonal plane including the top surface of the substrate 8. The patterned etch mask layer 207 is then removed by ashing or another suitable method. The anisotropic etch process removes portions of the second upper blanket electrically conductive layer 22L, the second elongated loop-shaped conductive material portions 18', and the first elongated loop-shaped conductive material portions 12' that are not masked by the patterned etch mask layer 207. Each of the c-shaped end segments (e.g., connecting segments) 18B of the second elongated loop-shaped conductive material portions 18' and the c-shaped end segments 12B of the first elongated loop-shaped conductive material portions 12' can be removed by the anisotropic etch process. Remaining portions (e.g., line segments 12A) of each first elongated loop-shaped conductive material portion 12' include a pair of first conductive lines 12 that extend along the first horizontal direction hd1. Remaining portions (e.g., line segments 18A) of each second elongated loop-shaped conductive material portion 18' include a pair of second lower conductive lines 18 that extend along the second horizontal direction hd2. A remaining portion of the second upper blanket electrically conductive layer 22L includes a conductive plate 22P having a pair of first edges extending along the first horizontal direction hd1 and having a pair of second edges extending along the second horizontal direction hd2.

In one embodiment, a void that at least partially laterally surrounds the first two-dimensional array of first memory pillar structures (16, 14, 17) can be formed by the anisotropic etch process. In one embodiment, the void is a continuous void that completely laterally surrounds the first two-dimensional array of first memory pillar structures (16, 14, 17). In another embodiment, the void is a discontinuous void that partially laterally surrounds the first two-dimensional array of first memory pillar structures (16, 14, 17). The void is herein referred to as a first moat trench 205. Generally, the first moat trench 205 at least partially laterally encloses the first two-dimensional array of first memory pillar structures (16, 14, 17). In one embodiment, the first moat trench 205 completely laterally encloses the first two-dimensional array of first memory pillar structures (16, 14, 17). In another embodiment, the first moat trench 205 partially laterally encloses the first two-dimensional array of first memory pillar structures (16, 14, 17). The first moat trench 205 can be formed by performing an anisotropic etch process that removes a peripheral region of the second upper blanket electrically conductive layer 22L, and parts of the first and second elongated loop-shaped conductive material portions (12', 18'). In one embodiment, the anisotropic etch process removes each of the second c-shaped end segments 18B, and each of the first c-shaped end segments 12B of the respective portions (18', 12'). In another embodiment, the anisotropic etch process removes portions of the first line segments 12A and/or portions of the second line segments 18B instead of or in addition to removing the second c-shaped end segments 18B and/or the first c-shaped end segments 12B.

In one embodiment, the first conductive lines 12 may function as first word lines provided at a first word line level WL0, the second lower conductive lines 18 may function as lower portions of first bit lines provided at a first lower bit line level BL0, and the conductive plate 22P may be subsequently patterned with a same pattern as the second lower conductive lines 18 to provide upper portions of the first bit lines provided at a first upper bit line level BL1. The depth TD of the first moat trench 205 can be selected such that the first moat trench 205 TD extends to or into the substrate 8. Thus, the loop cut process shown in FIG. 11B cuts the end portions of the first word line and the first bit line at the same time during the same patterning and etch step. This reduces the number of patterning and etch steps to decrease process cost, while reducing possible pattern collapse and short circuit generation.

Referring to FIGS. 11C and 13A-13E, a dielectric material is deposited in the first moat trench 205. An excess portion of the dielectric material can be removed from above a horizontal plane including a top surface of a remaining portion of the electrically conductive material layer (i.e., the conductive plate 22P). The remaining portion of the dielectric material filling the first moat trench 205 constitutes a first dielectric moat structure 206. Each of the first line segments of the first elongated loop-shaped conductive material portions 12' (i.e., the first conductive lines 12) and each of the second line segments of the second elongated loop-shaped conductive material portions 18' (i.e., the second lower conductive lines 18) that underlie that conductive plate 22P contacts a respective pair of sidewalls of the first dielectric moat structure 206. The top surface of the first dielectric moat structure 206 can be coplanar with the top surface of the conductive plate 22P.

Referring to FIGS. 14A-14E, a second phase change memory material layer, a second selector layer, and an optional second barrier layer can be formed by repeating a subset of processing steps of FIGS. 1A and 1B. The second phase change memory material layer can include the same layer stack as the first phase change memory layer 16L. The second selector layer can include the same layer stack as the first selector layer 14L. The optional second barrier layer can have the same composition and the same thickness as the optional first barrier layer 17L.

The processing steps of FIGS. 2A and 2B, 3A and 3B, 4A and 4B, 5A-5E, and 6A-6C can be repeated with a modification in the pattern of material layers. For example, third template line structures (not shown) extending along the second direction can be formed over the second selector layer and the optional second barrier layer by performing the processing steps of FIGS. 2A and 2B with a 90 degree rotation in the pattern. The pattern of the third template line structures may be identical to the pattern of the second template line structures described above. Subsequently, third etch mask spacers (not shown) can be formed around the third template line structures by performing the processing steps of FIGS. 2A, 2B, 3A, and 3B. Third etch mask spacers can have a line and space pattern, and include lengthwise line segments having the same shape as, and having an areal overlap with, the second lower conductive lines 18. Each third etch mask spacer laterally surrounds a respective one of the third template line structures. In one embodiment, the lengthwise portions of the third etch mask spacers that extend along the second horizontal direction hd2 have a same center-to-center distance throughout, which can be the same as one half of the pitch of the third template line structures. Thus, pitch doubling can be achieved for the lengthwise portions of the third etch mask spacers relative to the pitch of the third template line structures. The third template line structures can be subsequently removed selective to the third etch mask spacers.

The pattern in the third etch mask spacers can be transferred through the optional second barrier layer, the second selector layer, the second phase change memory material layer, the conductive plate 22P (which is a remaining portion of the second upper blanket electrically conductive layer 22L) and an upper portion of the first dielectric moat structure 206 by a pattern transfer process such as an anisotropic etch process. Third stacked elongated loop-shaped structures that laterally extend along the second horizontal direction hd2 are formed. Each third stacked elongated loop-shaped structure can include, from bottom to top, a composite elongated loop-shaped structure, a second elongated loop-shaped phase change memory material portion that is a patterned portion of the second phase change memory layer, a second elongated loop-shaped selector material portion that is a patterned portion of the second selector layer, a second elongated loop-shaped barrier material portion that is a patterned portion of the second barrier layer. The third stacked elongated loop-shaped structures are laterally spaced apart by line trenches that laterally extend along the second horizontal direction, which are herein referred to as lower second-level trenches.

The composite elongated loop-shaped structure includes a pair of third conductive line structures and a pair of c-shaped end segments, which may be dielectric end segments that comprise patterned portions of the first dielectric moat structure 206. The third conductive line structures are patterned portions of the conductive plate 22P, which are herein referred to as second upper conductive lines 22. Each second upper conductive line 22 is a third line segment that is formed directly on a respective second line segment that is embodied as a second lower conductive line 18. The second upper conductive lines 22 (i.e., the third line segments) are arranged as a one-dimensional periodic array having the uniform second pitch along the first horizontal direction hd1. Each second upper conductive line 22 includes a vertical stack of a metal portion 222 and an electrode buffer portion 224. Each metal portion 222 is a patterned portion of a second metal layer 222L, and each electrode buffer portion 222 is a patterned portion of a second electrode buffer layer 224L. Each second upper conductive line 22 (i.e., a third line segment) can be formed directly on a top surface of a respective one of the second lower conductive line 18 (i.e., a second line segment). Each second upper conductive lines 22 (i.e., the third line segments) can have the same pattern as, and the same periodicity along the first horizontal direction hd1, as the second lower conductive lines 18 (i.e., the second line segments). Each vertical stack of a second lower conductive line 18 and a second upper conductive line 22 constitutes a second conductive line (18, 22), which may be a first bit line located in levels BL0 and BL1.

Portions of the first dielectric moat structure 206 that are not masked by the third etch mask spacers are vertically recessed below the horizontal plane including the top surfaces of the second upper conductive lines 22. Unrecessed portions of the first dielectric moat structure 206 form the c-shaped dielectric end segments. Each c-shaped dielectric end segment contacts sidewalls of two second upper conductive lines 22, and is a vertically protruding portion of the first dielectric moat structure 206. The third stacked elongated loop-shaped structures laterally extend along the second horizontal direction hd2, are laterally spaced among one another by the lower second-level trenches.

The processing steps of FIGS. 6A-6C can be subsequently performed to form lower second-level dielectric isolation structure (252, 254) in the lower second-level trenches, which can include the same material stack as the lower first-level dielectric isolation structure (152, 154). Each second-level dielectric isolation structure (252, 254) can include a combination of a lower second-level dielectric liner 252 and a lower second-level dielectric fill material portion 254.

The processing steps of FIGS. 7A-7C can be performed with a 90 degree rotation in the pattern to form a third lower blanket electrically conductive layer and fourth etch mask spacers. The third lower blanket electrically conductive layer can have same material composition as, and the same thickness as, the second lower blanket electrically conductive layer 18L. The fourth etch mask spacers can have the same pattern as the first etch mask spacers 197, and can be formed by performing the same processing steps as the processing steps of FIGS. 2A and 2B, 3A and 3B, and 4A and 4B.

The processing steps of FIGS. 8A-8C can be subsequently performed to form upper second level trenches. The upper second-level trenches are formed through the second lower blanket electrically conductive layer, the second elongated loop-shaped barrier material portions, the second elongated loop-shaped selector material portions, the second elongated loop-shaped phase change memory material portions, and the lower second-level dielectric isolation structures (252, 254). The materials of the second lower blanket electrically conductive layer, the second elongated loop-shaped barrier material portions, the second elongated loop-shaped selector material portions, the second elongated loop-shaped phase change memory material portions, and the lower second-level dielectric isolation structures (252, 254) can be etched selective to the material in the top portions of the second upper conductive lines 22 by an anisotropic etch process. Volumes from which the materials of the second lower blanket electrically conductive layer, the second elongated loop-shaped barrier material portions, the second elongated loop-shaped selector material portions, the second elongated loop-shaped phase change memory material portions, and upper regions of the lower second-level dielectric isolation structures (252, 254) are removed constitute the upper second-level trenches. The upper second-level trenches laterally extend along the first horizontal direction hd1.

The second lower blanket electrically conductive layer is divided into a one-dimensional array of elongated loop-shaped conductive material portions, which are herein referred to as third elongated loop-shaped conductive material portions 28' (which can be portions of word lines for example). Each vertical stack of a second elongated loop-shaped barrier material portion, a second elongated loop-shaped phase change memory material portions, and a second elongated loop-shaped selector material portions is divided into two rows of second memory pillar structures (26, 24, 27) that are laterally spaced apart long the first horizontal direction hd1. The combination of the second elongated loop-shaped barrier material portions, the second elongated loop-shaped phase change memory material portions, and the second elongated loop-shaped selector material portions is divided into a two-dimensional array of second memory pillar structures (26, 24, 27), which may be a periodic two-dimensional array. The two-dimensional array of second memory pillar structures (26, 24, 27) can form a rectangular periodic two-dimensional array.

Each second memory pillar structure (26, 24, 27) includes, from bottom to top, a second phase change memory pillar structure 26 that is a patterned portion of an elongated loop-shaped phase change memory material portion, a second selector pillar 24 that is a patterned portion of a second elongated loop-shaped selector material portion, and an optional second barrier plate 27 that is a patterned portion of a second barrier portion.

Each second phase change memory pillar structure 26 is a phase change memory element, i.e., a structure that changes the resistance depending on the phase of a material therein. In one embodiment, each second phase change memory pillar structure 26 can include a vertical stack of an optional second lower spacer plate 262 that is a patterned portion of a second optional lower spacer portion, a second phase change memory material pillar 264 that is a patterned portion of a second phase change memory material portion, and a second optional upper spacer plate 266 that is a patterned portion of a second upper spacer portion. In one embodiment, each sidewall of the second phase change memory material pillars 264 may be vertical or substantially vertical.

Each second selector pillar 24 is a selector element, i.e., an element that provides non-linear voltage-current characteristics such that the element functions as a conductor under second voltage bias conditions and as an insulator under second voltage bias conditions. In one embodiment, each second selector pillar 24 can include a second ovonic threshold switch material portion 24 that is a patterned portion of a second ovonic threshold switch material portion.

Each lower second-level dielectric isolation structure (252, 254) has a laterally undulating height after the anisotropic etch process. Each lower second-level dielectric isolation structure (252, 254) can continuously extend underneath a plurality of upper second-level trenches. The second barrier plates 27 are barrier elements, and can be arranged in a two-dimensional periodic array.

The processing steps of FIGS. 9A-9E can be performed to form upper second-level dielectric isolation structures (256, 258). Each upper second-level dielectric isolation structure (256, 258) can have the same material stack as an upper first-level dielectric isolation structure (156, 158). Each upper second-level dielectric isolation structure (256, 258) can include an upper second-level dielectric liner 256 and an upper second-level dielectric fill material portion 258. Each contiguous set of an upper second-level dielectric liner 256 and an upper second-level dielectric fill material portion 258 constitutes an upper second-level dielectric isolation structure (256, 258), which is a dielectric isolation structure having straight lengthwise sidewalls. The upper second-level dielectric isolation structure (256, 258) is formed in each of the upper second-level trenches. The upper second-level dielectric isolation structures (256, 258) laterally extend along the first horizontal direction hd1, and are laterally spaced among one another along the second horizontal direction hd2. The top surfaces of the upper second-level dielectric isolation structures (256, 258) can be coplanar with the top surfaces of the second elongated loop-shaped conductive material portions 28'.

Figure 15A:
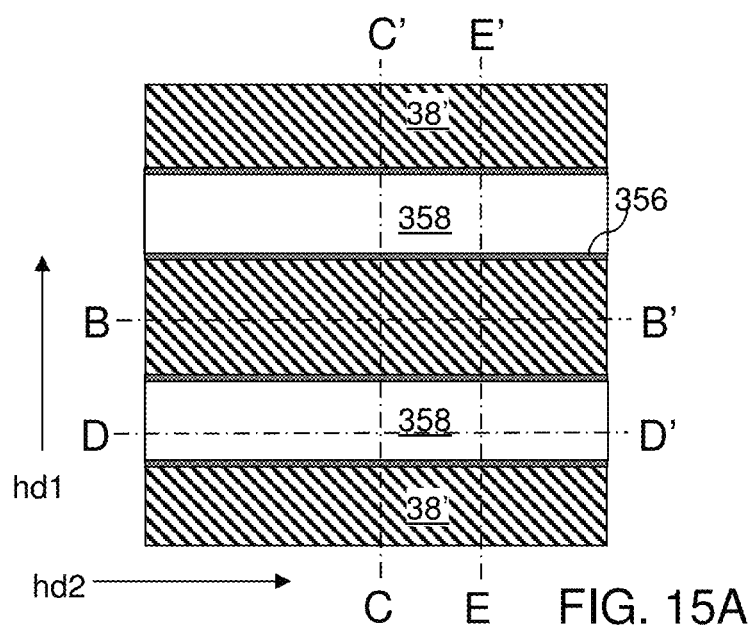
FIG. 15A is a vertical cross-sectional view of a region of the exemplary structure after formation of a two-dimensional array of third memory pillar structures and a third-level dielectric matrix according to an embodiment of the present disclosure.
Figures 15B, 15C:
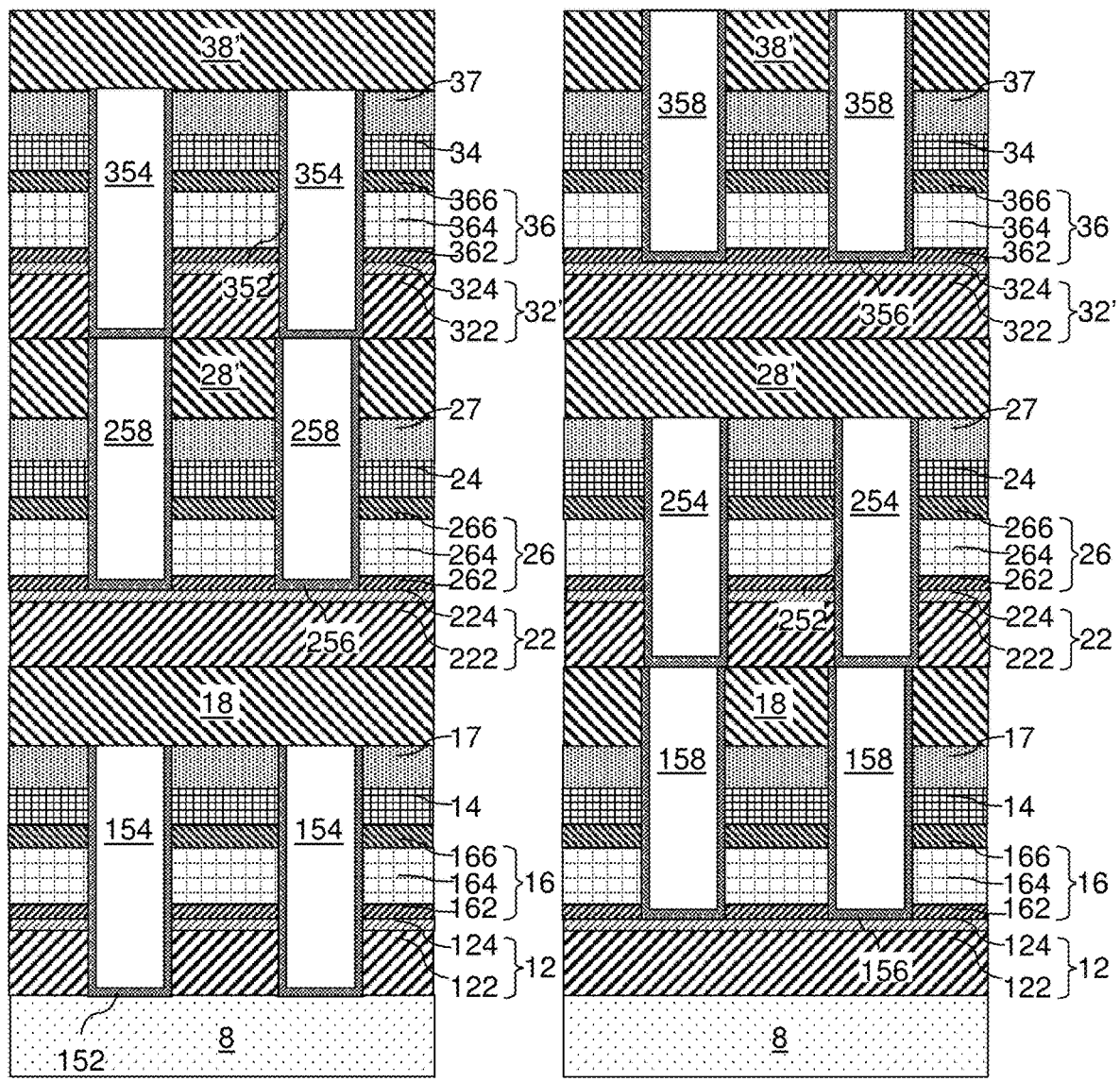
FIG. 15B is a vertical cross-sectional view along the vertical plane B-B' of FIG. 15A.
FIG. 15C is a vertical cross-sectional view along the vertical plane C-C' of FIG. 15A.

Referring to FIGS. 15A-15C, the processing steps of FIGS. 1A and 1B, 2A and 2B, 3A and 3B, 4A and 4B, 5A-5E, 6A-6C, 7A-7C, 8A-8C, and 9A-9E can be performed with the same pattern to form a third level structure including a third two-dimensional array of third memory pillar structures (36, 34, 37). The third level structure can include fourth elongated loop-shaped conductive material portion 32' (which can have the same pattern and the same material composition as the first elongated loop-shaped conductive material portion 12'), third phase change memory pillar structures 36 (which can have the same pattern and the same material composition as the first phase change memory pillar structures 16), third selector pillars 34 (which can have the same pattern and the same material composition as the first selector pillars 14), optional third barrier plates 37 (which can have the same pattern and the same material composition as the first barrier plates 17), lower third-level dielectric isolation structures (352, 354) (which can have the same pattern and the same material composition as the lower first-level dielectric isolation structures (152, 154)), upper third-level dielectric isolation structures (156, 158) (which can have the same pattern and the same material composition as the upper first-level dielectric isolation structures (156, 158)), and fifth elongated loop-shaped conductive material portions 38' (which can have the same pattern and the same material composition as the second elongated loop-shaped conductive material portions 18'). Each fourth elongated loop-shaped conductive material portion 32' can include a vertical stack of a third metal portion 222 and a third electrode buffer portion 324. Each third phase change memory pillar structure 36 can include a vertical stack of an optional third lower spacer plate 362, a third phase change memory material pillar 364, and a third optional upper spacer plate 366.

Figure 16A:
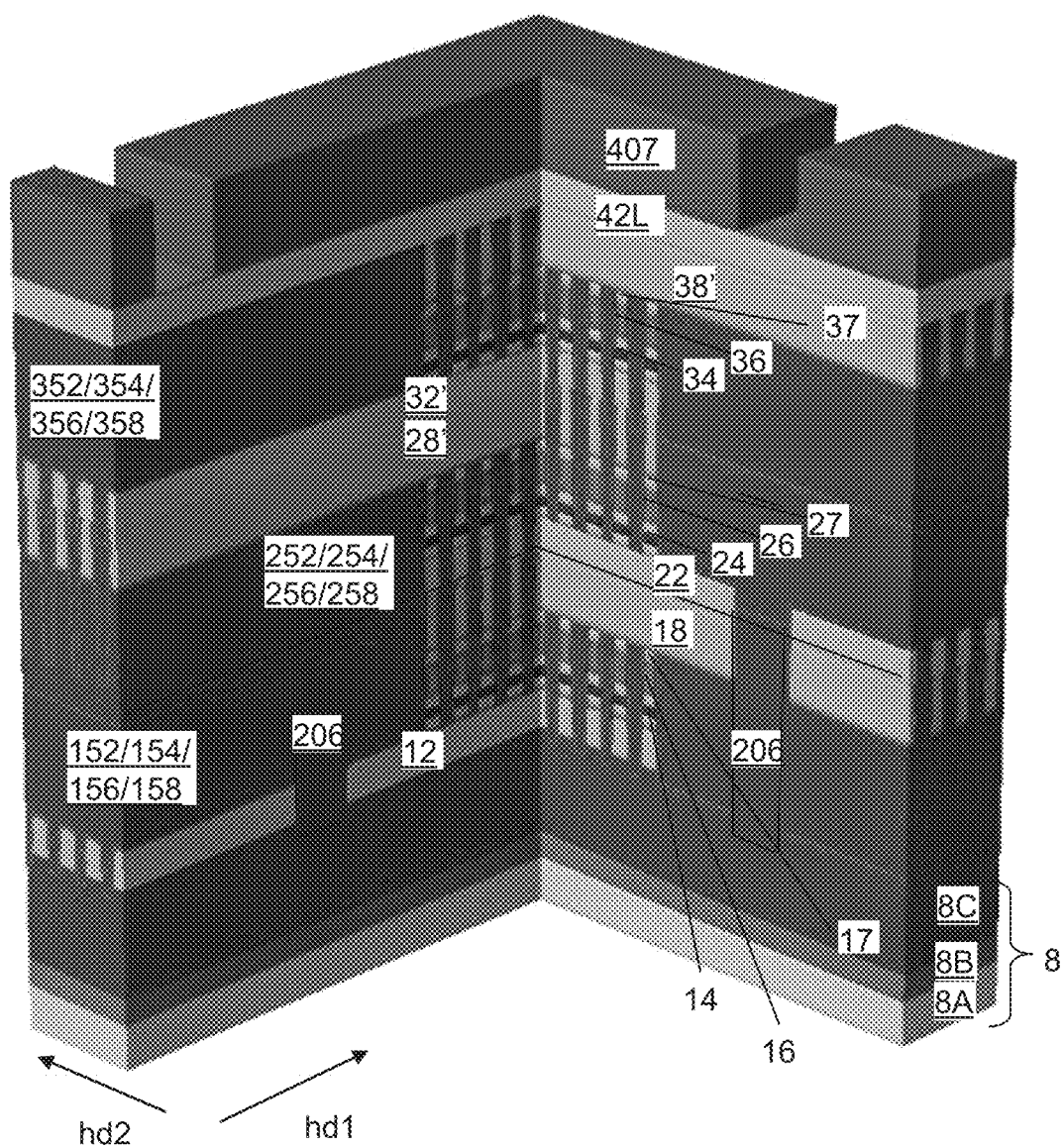
FIGS. 16A-16C are sequential perspective views of a cut-out portion of the exemplary structure during formation of a second moat trench and a second dielectric moat trench fill structure according to an embodiment of the present disclosure.

Referring to FIG. 16A, an electrically conductive material layer is formed on top of the fifth elongated loop-shaped conductive material portions 38'. The electrically conductive material layer can be deposited as a blanket material layer, and is herein referred to as a fourth upper blanket electrically conductive layer 42L. The fourth upper blanket electrically conductive layer 42L includes at least one conductive material layer, which can be at least one metallic material layer. For example, the fourth upper blanket electrically conductive layer 42L can include a layer stack including, from bottom to top, a fourth metal layer (such as a tungsten layer) and a fourth electrode buffer layer (such as a tungsten nitride layer, a titanium nitride layer, a carbon layer, a carbon layer, or combination thereof). The thickness of the fourth metal layer can be in a range from 20 nm to 100 nm, such as from 30 nm to 70 nm, although lesser and greater thicknesses can also be employed.

A patterned etch mask layer 407 is formed over the fourth upper blanket electrically conductive layer 42L within an area that covers an entirety of the third two-dimensional array of third memory pillar structures (36, 34, 37). C-shaped end segments of the third elongated loop-shaped conductive material potions 28', c-shaped end segments of the fourth elongated loop-shaped conductive material potions 32' and c-shaped end segments of the fifth elongated loop-shaped conductive material portion portions 38' are not covered by the patterned etch mask layer 407. In one embodiment, the patterned etch mask layer 407 comprises a lithographically patterned photoresist layer having a rectangular horizontal cross-sectional shape.

Figure 16B:
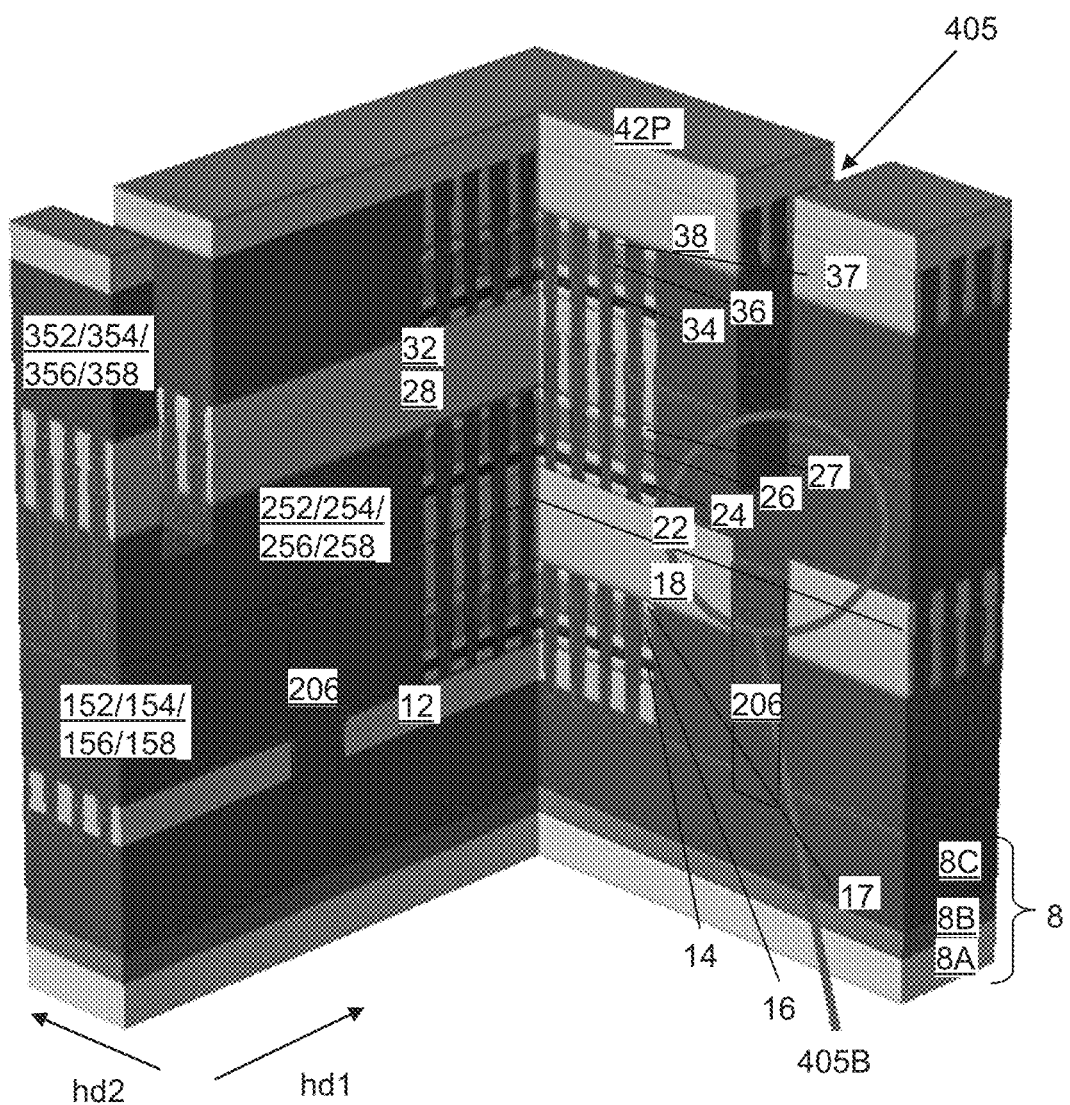

Referring to FIG. 16B, an anisotropic etch process is performed to etch through material portions that are not masked by the patterned etch mask layer 407 and are above the horizonal plane including the bottom surfaces of third elongated loop-shaped conductive material potions 28'. The anisotropic etch process removes portions of the fourth upper blanket electrically conductive layer 42L, the fifth elongated loop-shaped conductive material portions 38', the fourth elongated loop-shaped conductive material portions 32', and the third elongated loop-shaped conductive material portions 28' that are not masked by the patterned etch mask layer 407. Each of the c-shaped end segments (e.g., connecting segments) of the fifth, fourth, and third elongated loop-shaped conductive material portions (38', 32', 28') can be removed by the anisotropic etch process.

In one embodiment, a void that at least partially laterally surrounds the third two-dimensional array of third memory pillar structures (36, 34, 37) can be formed by the anisotropic etch process. In one embodiment, the void is a continuous void that completely laterally surrounds the third two-dimensional array of third memory pillar structures (36, 34, 37). In another embodiment, the void is a discontinuous void that partially laterally surrounds the third two-dimensional array of third memory pillar structures (36, 34, 37). The void is herein referred to as a second moat trench 405. The bottom region 405B of the second moat trench 405 can be formed below the horizontal plane including the bottom surfaces of the third conductive lines (28, 32), which may be second word lines located in levels WL3 and WL4. Generally, the second moat trench 405 at least partially laterally encloses the third two-dimensional array of third memory pillar structures (36, 34, 37). In one embodiment, the second moat trench 405 completely laterally encloses the third two-dimensional array of third memory pillar structures (36, 34, 37). In another embodiment, the second moat trench 405 partially laterally encloses the third two-dimensional array of third memory pillar structures (36, 34, 37).

The second moat trench 405 can be formed by performing an anisotropic etch process that removes a peripheral region of the fourth upper blanket electrically conductive layer 42L, and parts of the third, fourth and fifth elongated loop-shaped conductive material portions (28', 32', 38'). In one embodiment, the anisotropic etch process removes each of the fifth c-shaped end segments of the fifth elongated loop-shaped conductive material portions 38', each of the fourth c-shaped end segments of the fourth elongated loop-shaped conductive material portions 32', and each of the third c-shaped end segments of the third elongated loop-shaped conductive material portions 28'. In another embodiment, the anisotropic etch process removes portions of the line segments instead of or in addition to removing the c-shaped end segments.

Remaining portions of each fifth elongated loop-shaped conductive material portion 38' include a pair of fourth lower conductive lines 38 that extend along the second horizontal direction hd2. Remaining portions of each fourth elongated loop-shaped conductive material portion 32' include a pair of third upper conductive lines 32 that extend along the first horizontal direction hd1. Remaining portions of each third elongated loop-shaped conductive material portion 28' include a pair of third lower conductive lines 28 that extend along the first horizontal direction hd1. A remaining portion of the fourth upper blanket electrically conductive layer 42L includes a conductive plate 42P having a pair of first edges extending along the first horizontal direction hd1 and having a pair of second edges extending along the second horizontal direction hd2.

Each third upper conductive line 32 can be formed directly on a top surface of a respective one of the third lower conductive line 28. Each third upper conductive lines 32 can have the same pattern as, and the same periodicity along the first horizontal direction hd1, as the third lower conductive lines 28. Each vertical stack of a third lower conductive line 28 and a third upper conductive line 32 constitutes a third conductive line (28, 32), which may be the second word line.

Figure 16C:
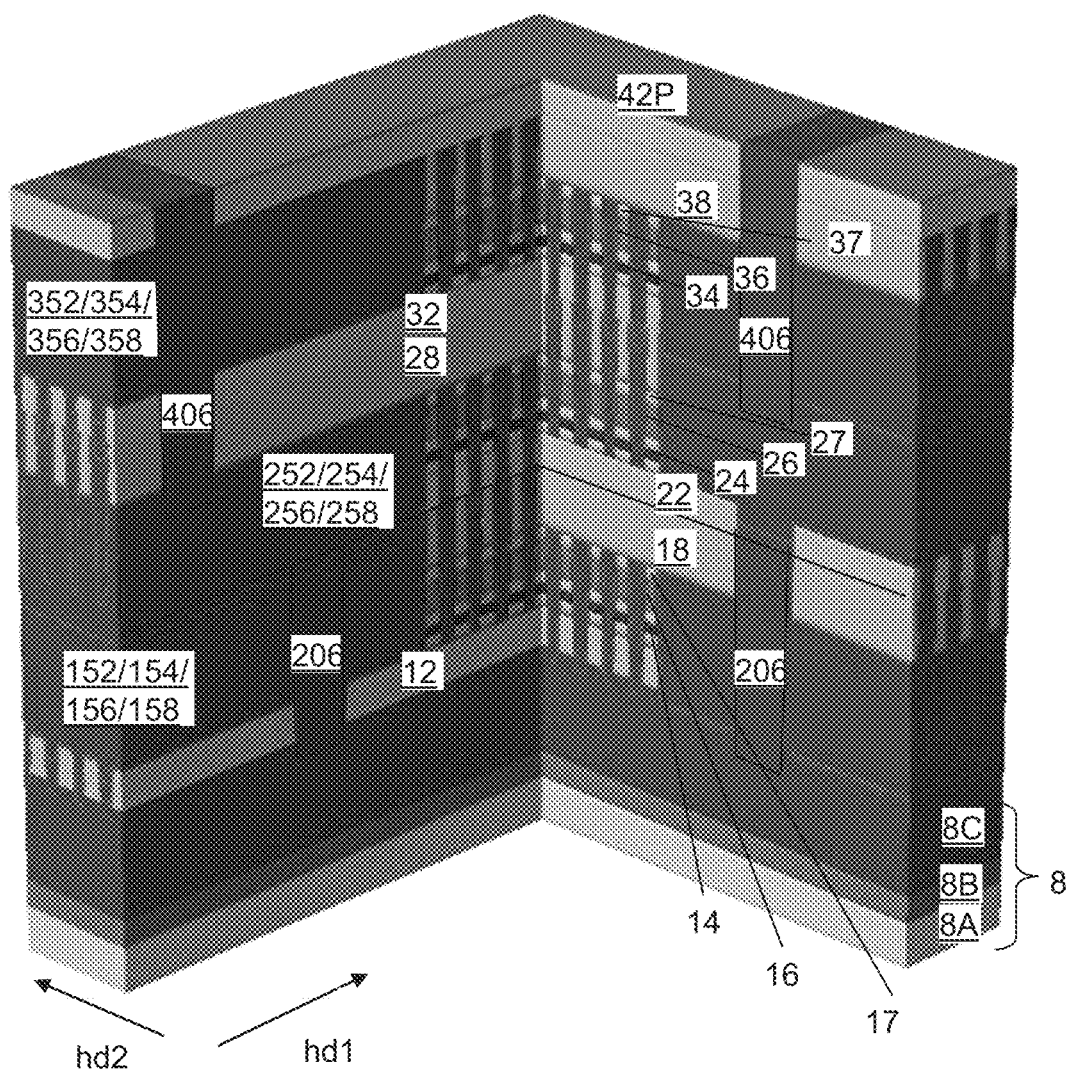

Referring to FIG. 16C, a dielectric material is deposited in the second moat trench 405. An excess portion of the dielectric material can be removed from above a horizontal plane including a top surface of a remaining portion of the electrically conductive material layer (i.e., the conductive plate 42P). The remaining portion of the dielectric material filling the second moat trench 405 constitutes a second dielectric moat structure 406. Each of the third conductive lines (28, 32) and each of the fourth lower conductive lines 38 that underlie that conductive plate 42P contacts a respective pair of sidewalls of the second dielectric moat structure 406. The top surface of the second dielectric moat structure 406 can be coplanar with the top surface of the conductive plate 42P.

Figure 17A:
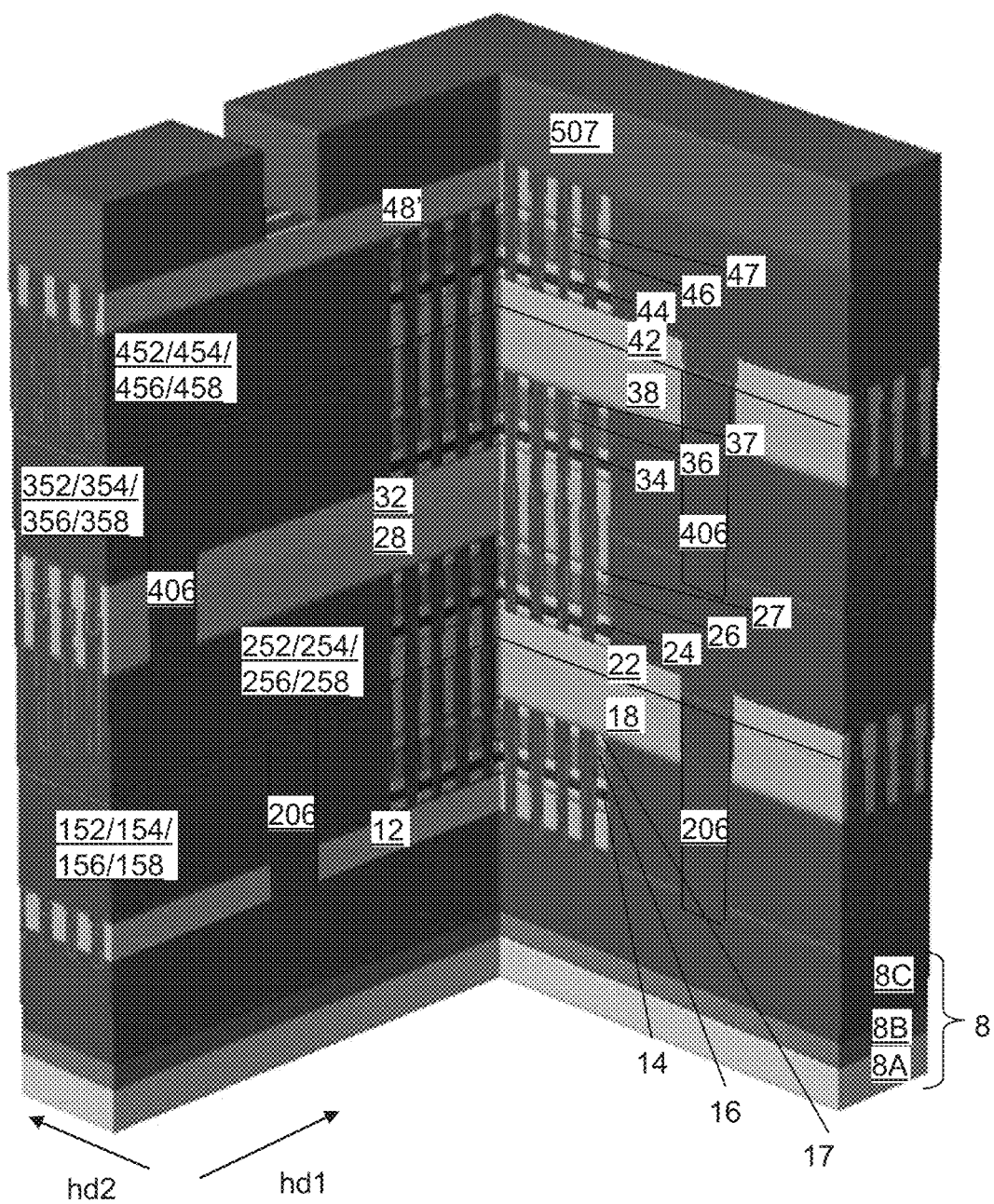
FIGS. 17A-17C are sequential perspective views of a cut-out portion of the exemplary structure during formation eighth line segments and a dielectric isolation structure according to an embodiment of the present disclosure.

Referring to FIG. 17A, at least one additional level including a respective additional two-dimensional array of additional memory pillar structures may be formed. In an illustrative example, a fourth level structure including a fourth two-dimensional array of fourth memory pillar structures (46, 44, 47), fourth upper conductive lines 42, sixth elongated loop-shaped conductive material portions 48', lower fourth-level dielectric isolation structures (452, 454), and upper fourth-level dielectric isolation structures (456, 458) can be formed by repeating the processing steps for forming the second level structure. The fourth conductive lines (38, 42) may comprise second bit lines located in levels BL5 and BL6. Specifically, the fourth two-dimensional array of fourth memory pillar structures (46, 44, 47), the fourth upper conductive lines 42, the sixth elongated loop-shaped conductive material portions 48', the lower fourth-level dielectric isolation structures (452, 454), and the upper fourth-level dielectric isolation structures (456, 458) can be formed by repeating the processing steps for forming the second two-dimensional array of third memory pillar structures (26, 24, 27), the second upper conductive lines 22, the third elongated loop-shaped conductive material portions 28', the lower second-level dielectric isolation structures (252, 254), and the upper second-level dielectric isolation structures (256, 258).

In case the conductive lines to be formed by patterning the sixth elongated loop-shaped conductive material portions 48' include the topmost level conductive lines for the three-dimensional memory array to be formed, a patterned etch mask layer 507 can be formed over the sixth elongated loop-shaped conductive material portions 48' within an area that covers an entirety of the fourth two-dimensional array of fourth memory pillar structures (46, 44, 47). C-shaped end segments of the sixth elongated loop-shaped conductive material portions 48' are not covered by the patterned etch mask layer 507. In one embodiment, the patterned etch mask layer 507 comprises a lithographically patterned photoresist layer having a rectangular horizontal cross-sectional shape.

Figure 17B:
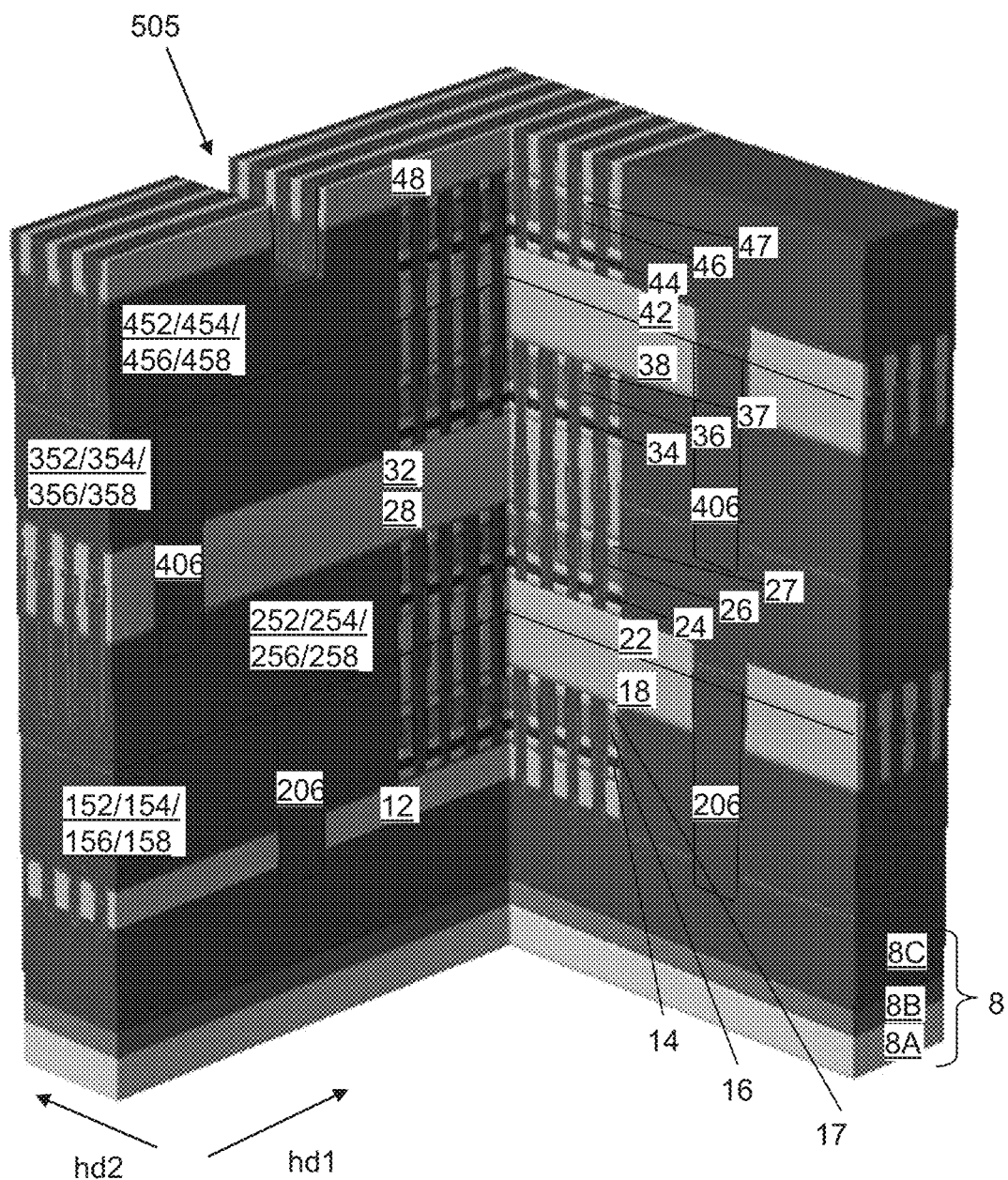

Referring to FIG. 17B, an anisotropic etch process is performed to etch through material portions that are not masked by the patterned etch mask layer 507 and are above the horizonal plane including the bottom surfaces of elongated loop-shaped conductive material potions that need to be cut, such as the sixth elongated loop-shaped conductive material portions 48'. The anisotropic etch process removes portions of the sixth elongated loop-shaped conductive material portions 48' that are not masked by the patterned etch mask layer 507. Each of the c-shaped end segments (e.g., connecting segments) of the sixth elongated loop-shaped conductive material portions 48' can be removed by the anisotropic etch process.

In one embodiment, at least one trench 505 can be formed by the anisotropic etch process. Each trench 505 can vertically extend below the horizontal plane including the bottom surfaces of the sixth elongated loop-shaped conductive material portions 48'. The sixth elongated loop-shaped conductive material portions 48' can be truncated at end portions to provide fifth conductive lines 48, which may be third word lines located in levels WL7 and WL8.

Figure 17C:
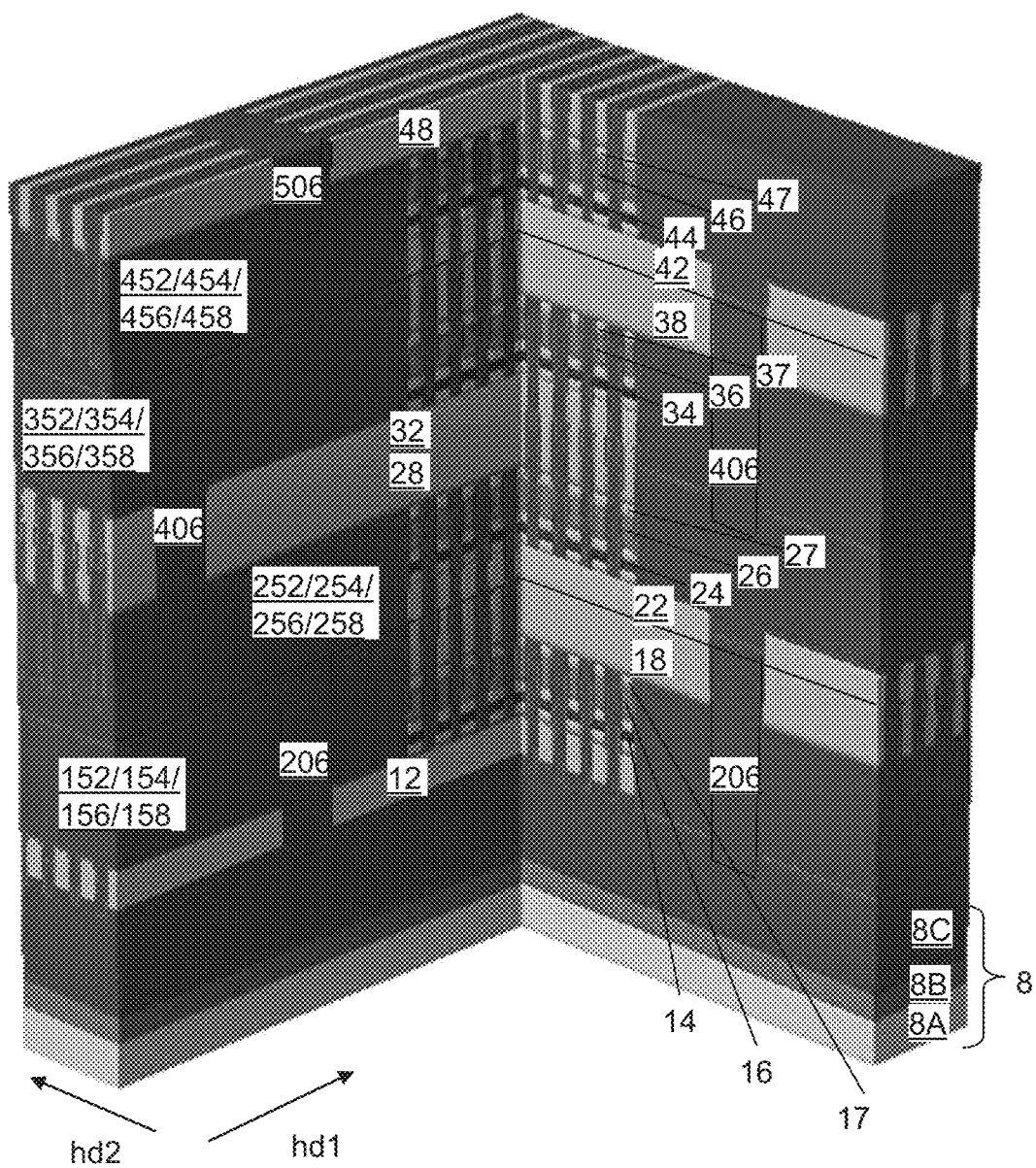

Referring to FIG. 17C, each trench 505 can be filled with a dielectric material to form a dielectric trench fill material portion 506 therein. Each dielectric trench fill material portion 506 can include a dielectric material such as silicon oxide. In one embodiment, the at least one dielectric trench fill material portion 506 may be formed as a dielectric moat trench fill structure. The processing steps described above may be repeated any suitable number of times to form additional device levels.

Figure 18:
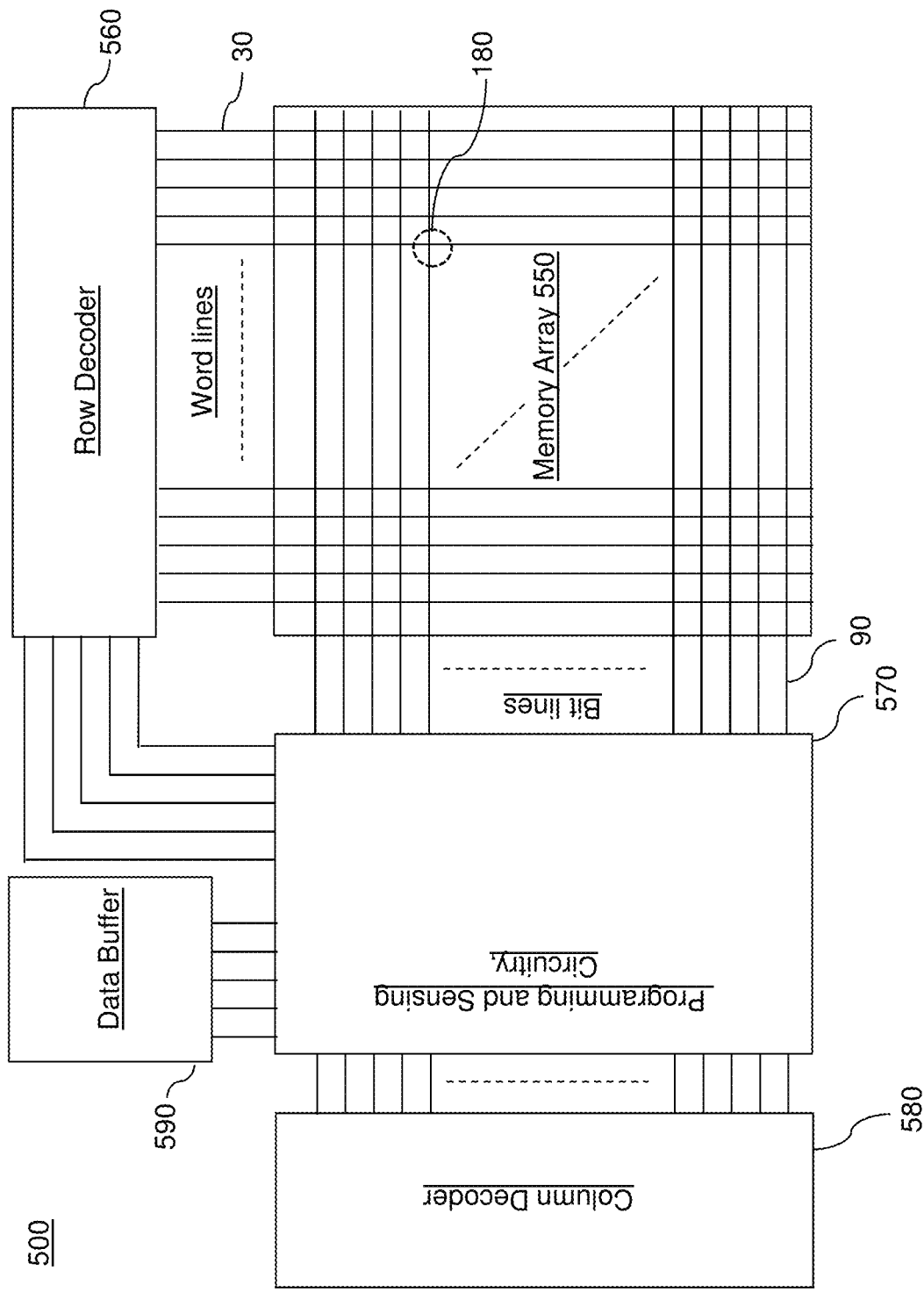
FIG. 18 is an exemplary circuit schematic of a memory device including a two-dimensional or a three-dimensional array of memory elements of the present disclosure.

Referring to FIG. 18, a schematic diagram is shown for a phase change memory device 500 including memory pillar structures 180 in an array configuration. The memory pillar structures 180 may be any of the first memory pillar structures (16, 14, 17), the second memory pillar structures (26, 24, 27), the third memory pillar structures (36, 34, 37), the fourth memory pillar structures (46, 44, 47), or any additional memory pillar structures that may be formed above the fourth memory pillar structures (46, 44, 47) described above by performing additional processing steps. As used herein, a phase change memory device refers to any memory device that employs a phase change material providing at least two resistivity states, such as a combination of a high (i.e., higher) resistivity amorphous state and a low (i.e., lower) resistivity crystalline (e.g., polycrystalline) state. The phase change memory device can be configured as a random access memory device. As used herein, a "random access memory device" refers to a memory device including memory cells that allow random access, i.e., access to any selected memory cell upon a command for reading the contents of the selected memory cell.

The phase change memory device 500 of an embodiment of the present disclosure includes a memory array region 550 containing an array of memory pillar structures 180 located at the intersection of the respective word lines 30 and bit lines 90. The phase change memory device 500 may also contain a row decoder 560 connected to the word lines 30, a programming and sensing circuitry 570 (e.g., a sense amplifier and other bit line control circuitry) connected to the bit lines 90, a column decoder 580 connected to the bit lines 90 and a data buffer 590 connected to the sense circuitry. Multiple instances of the memory pillar structures 180 are provided in an array configuration in the phase change memory device 500.

In one embodiment, the odd-numbered conductive lines (such as the first conductive lines 12, the third conductive lines (28, 32), and the fifth conductive lines 48) may comprise the word lines 30, and the even-numbered conductive lines (such as the second conductive lines (18, 22) and the fourth conductive lines (38, 42)) may comprise the bit lines 90. In another embodiment, the odd-numbered conductive lines (such as the first conductive lines 12, the third conductive lines (28, 32), and the fifth conductive lines 48) may comprise the bit lines 90, and the even-numbered conductive lines (such as the second conductive lines (18, 22) and the fourth conductive lines (38, 42)) may comprise the word lines 30.

Generally, each memory pillar structure within a two-dimensional array of memory pillar structures located at each level can be configured to be individually accessed by a combination of a respective word line 30 and a respective bit line 90. The device structure can have a configuration selected from a first configuration in which the bit lines 90 comprise first line segments formed by truncation of first elongated loop-shaped conductive material portions and the word lines 30 comprise second line segments formed by truncation of second elongated loop-shaped conductive material portions and overlie the first line segments, and a second configuration in which the word lines 30 comprise first line segments formed by truncation of first elongated loop-shaped conductive material portions and the bit lines 90 comprise second line segments formed by truncation of second elongated loop-shaped conductive material portions and overlie the first line segments. The two-dimensional arrays of memory pillar structures can be vertically stacked as described above to provide a three-dimensional array of memory pillar structures.

The various embodiments of the present disclosure remove the c-shaped end segments of elongated loop-shaped conductive material portions located at multiple levels, while controlling the maximum depth of each moat trench to the sum of the height of a single level and the thickness of an electrically conductive material layer, thereby limiting the etch distance for the anisotropic etch process that forms the moat trench. Thus, the loop cut process of the embodiments of the present disclosure cuts the end portions of word lines and bit lines in adjacent vertically separated device levels at the same time during the same patterning and etch step. This reduces the number of patterning and etch steps to decrease process cost, compared to performing a separate loop cut process in each device level (e.g., on each level of word lines and bit lines) before or after etching the stack of layers underlying the loop cut etch mask layer (e.g., layer 197, etc.). Furthermore, by not performing the loop cut process during the patterning of the word lines and bit lines (e.g., by not removing the end segments of the etch mask layer or of the entire loop shaped stack during stack etching), the chance of short circuit generation and/or pattern collapse (e.g., collapse of the etched stack) is reduced.

Vertically-neighboring pairs of dielectric moat trench fill structures (such as the pair of the first dielectric moat trench fill structure 206 and the second dielectric moat trench fill structure 406) may be vertically spaced from each other at least by the height of a two-dimensional array of memory pillar structures located therebetween, and may be vertically spaced from each other by as much as the sum of the height of a two-dimensional array of memory pillar structures located therebetween and the thickness of a set of line segments (such as the second upper conductive line 22). Thus, the methods of the embodiments of the present disclosure provide multi-level loop cutting for the c-shaped end segments of elongated loop-shaped conductive material portions located at multiple levels while forming moat trenches employing known etch processes.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a device structure, comprising:
   forming first elongated loop-shaped conductive material portions over a substrate, wherein each of the first elongated loop-shaped conductive material potions includes a respective pair of first line segments and a respective pair of first end segments adjoined to ends of the respective pair of first line segments;
   forming a two-dimensional array of memory pillar structures over the first elongated loop-shaped conductive material portions;

forming second elongated loop-shaped conductive material portions over the two-dimensional array of memory pillar structures, wherein each of the second elongated loop-shaped conductive material potions includes a respective pair of second line segments and a respective pair of second end segments adjoined to ends of the respective pair of second line segments;

forming an electrically conductive material layer on top surfaces of the second elongated loop-shaped conductive material portions; and forming a moat trench that at least partially laterally encloses the two-dimensional array of memory pillar structures by performing an anisotropic etch process that removes, in sequential order, a peripheral portion of the electrically conductive material layer, parts of the second elongated loop-shaped conductive material portions, and parts of the first elongated loop-shaped conductive material portions.

2. The method of claim 1, further comprising:

forming a patterned etch mask layer over the electrically conductive material layer within an area that covers the two-dimensional array of memory pillar structures, wherein the peripheral region of the electrically conductive material layer, the parts of the second elongated loop-shaped conductive material portions, and the parts of the first elongated loop-shaped conductive material portions that are removed by the anisotropic etch process are located within areas that are not masked by the patterned etch mask layer.

3. The method of claim 2, wherein:

the patterned etch mask layer comprises a lithographically patterned photoresist layer having a rectangular horizontal cross-sectional shape; and the anisotropic etch process removes each of the second end segments, and each of the first end segments.

4. The method of claim 1, wherein:

each of the first line segments laterally extends along a first horizontal direction; and each of the second line segments laterally extend along a second horizontal direction.

5. The method of claim 4, wherein:

remaining portions of the first elongated loop-shaped conductive material portions after the anisotropic etch process comprises first conductive line structures that extend along the first horizontal direction and having a uniform first pitch along the second horizontal direction; and remaining portions of the second elongated loop-shaped conductive material portions after the anisotropic etch process comprises second conductive line structures that extend along the second horizontal direction and having a uniform second pitch along first horizontal direction.

6. The method of claim 5, wherein:

the first elongated loop-shaped conductive material portions are formed as a periodic one-dimensional array having a periodicity that is twice the uniform first pitch along the second horizontal direction; and the second elongated loop-shaped conductive material portions are formed as a periodic one-dimensional array having a periodicity that is twice the uniform second pitch along the first horizontal direction.

7. The method of claim 4, further comprising:

forming a first blanket electrically conductive layer over the substrate;

forming first template line structures extending along the first horizontal direction over the first blanket electrically conductive layer;

forming first etch mask spacer structures around each of the first template line structures;

removing the first template line structures selective to the first etch mask spacer structures and the first blanket electrically conductive layer; and transferring patterns in the first etch mask spacer structures through the first blanket electrically conductive layer, wherein remaining patterned portions of the first blanket electrically conductive layer constitute the first elongated loop-shaped conductive material portions.

8. The method of claim 7, wherein the template line structures are formed by:

applying and lithographically patterning a template material layer over the first blanket electrically conductive layer; and isotropically recessing remaining lithographically patterned portions of the template material layer to provide the template line structures.

9. The method of claim 7, further comprising:

forming lower first-level dielectric isolation structures between the first elongated loop-shaped conductive material portions;

forming a second lower blanket electrically conductive layer over the lower first-level dielectric isolation structures between the first elongated loop-shaped conductive material portions;

forming second template line structures extending along the second horizontal direction over the second lower blanket electrically conductive layer;

forming second etch mask spacer structures around each of the second template line structures;

removing the second template line structures selective to the second etch mask spacer structures and the second lower blanket electrically conductive layer; and transferring patterns in the second etch mask spacer structures through the second lower blanket electrically conductive layer, wherein remaining patterned portions of the second lower blanket electrically conductive layer constitute the second elongated loop-shaped conductive material portions.

10. The method of claim 2, further comprising patterning a remaining portion of the electrically conductive material layer that remains after the anisotropic etch process into third line segments that contact a top surface of a respective one of the second line segments by performing an additional anisotropic etch process, wherein the third line segments are arranged as a one-dimensional periodic array having the uniform second pitch along the first horizontal direction.

11. The method of claim 10, further comprising:

forming template line structures extending along the second horizontal direction over the remaining portion of the electrically conductive material layer and over the two-dimensional array of memory pillar structures after the anisotropic etch process;

forming etch mask spacer structures around each of the template line structures;

removing the template line structures selective to the etch mask spacer structures and the electrically conductive material layer; and transferring patterns in the etch mask spacer structures through the remaining portion of the electrically conductive material layer employing a pattern transfer process, wherein remaining patterned portions of the electrically conductive layer constitute third line segments.

12. The method of claim 11, wherein:
each of the third line segments contacts a top surface of a respective one of the second line segments; and
the third line segments have a same periodicity along the first horizontal direction as the second line segments.

13. The method of claim 3, further comprising forming a dielectric moat structure by depositing a dielectric material in the moat trench and by removing an excess portion of the dielectric material from above a horizontal plane including a top surface of a remaining portion of the electrically conductive material layer after the anisotropic etch process.

14. The method of claim 13, wherein:
the moat trench completely laterally encloses the two-dimensional array of memory pillar structures; and
each of the first line segments and each of the second line segments contacts a respective pair of sidewalls of the dielectric moat structure.

15. The method of claim 1, wherein each memory pillar structure within the two-dimensional array of memory pillar structures comprises:
a memory element comprising a memory material configured to provide at least two different states representing a respective bit; and
a selector element.

16. The method of claim 15, wherein:
the memory material comprises a phase change memory material; and
the selector element comprises an ovonic threshold voltage material.

17. The method of claim 16, further comprising forming a first dielectric matrix around the two-dimensional array of memory pillar structures, wherein the second elongated loop-shaped conductive material portions are formed within an upper region of the first dielectric matrix.

18. The method of claim 1, further comprising:
forming underlying elongated loop-shaped conductive material portions over the substrate, wherein each of the underlying elongated loop-shaped conductive material potions includes a respective pair of underlying line segments and a respective pair of underlying end segments adjoined to ends of the respective pair of underlying line segments, and wherein each of the first loop-shaped conductive material portions is formed over a respective one of the underlying elongated loop-shaped conductive material portions; and
removing the underlying end segments employing the anisotropic etch process.

19. The method of claim 1, wherein:
each memory pillar structure within the two-dimensional array of memory pillar structures is configured to be individually accessed by a combination of a respective word line and a respective bit line; and
the device structure has a configuration selected from:
a first configuration in which the bit lines comprise the first line segments and the word lines comprise the second line segments; or
a second configuration in which the word lines comprise the first line segments and the bit lines comprise the second line segments.

20. The method of claim 1 further comprising forming dielectric isolation structures between and on sidewalls of the second elongated loop-shaped conductive material portions, wherein:
the dielectric isolation structures have top surfaces within a horizontal plane including top surfaces of the second elongated loop-shaped conductive material portions;
the electrically conductive material layer is formed on top surfaces of the dielectric isolation structures and a bottom surface of the electrically conductive material layer contacts an entirety of each top surface of second elongated loop-shaped conductive material portions;
after performing the anisotropic etch process, a remaining portion of the electrically conductive material layer comprises a single conductive plate that contacts top surfaces of remaining portions of the second elongated loop-shaped conductive material portions; and
the single conductive plate contacts top surfaces of remaining portions of the dielectric isolation structures after performing the anisotropic etch process.

* * * * *